(12) United States Patent
Liu et al.

(10) Patent No.: US 11,664,358 B2
(45) Date of Patent: May 30, 2023

(54) DISPLAY APPARATUS

(71) Applicant: Au Optronics Corporation, Hsinchu (TW)

(72) Inventors: Chung-Chan Liu, Hsinchu (TW); Pin-Miao Liu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 178 days.

(21) Appl. No.: 17/168,199

(22) Filed: Feb. 5, 2021

(65) Prior Publication Data
US 2021/0384177 A1    Dec. 9, 2021

Related U.S. Application Data

(60) Provisional application No. 63/035,056, filed on Jun. 5, 2020.

(30) Foreign Application Priority Data

Sep. 4, 2020   (TW) .................................. 109130349

(51) Int. Cl.
| | | |
|---|---|---|
| *H01L 25/16* | (2023.01) | |
| *H01L 33/54* | (2010.01) | |
| *H01L 33/60* | (2010.01) | |
| *H01L 33/62* | (2010.01) | |
| *H01L 25/075* | (2006.01) | |

(52) U.S. Cl.
CPC ............ *H01L 25/167* (2013.01); *H01L 33/54* (2013.01); *H01L 33/60* (2013.01); *H01L 33/62* (2013.01); *H01L 2933/0058* (2013.01); *H01L 2933/0066* (2013.01)

(58) Field of Classification Search
CPC ... H01L 25/167; H01L 25/0753; H01L 33/60; H01L 33/54; H01L 33/38
See application file for complete search history.

(56) References Cited

U.S. PATENT DOCUMENTS

| | | | |
|---|---|---|---|
| 10,134,803 | B2 | 11/2018 | Chaji et al. |
| 2016/0218143 | A1 | 7/2016 | Chaji et al. |
| 2018/0358404 | A1 | 12/2018 | Chaji et al. |

(Continued)

FOREIGN PATENT DOCUMENTS

| | | |
|---|---|---|
| CN | 104037276 | 9/2014 |
| CN | 109075119 | 12/2018 |

(Continued)

*Primary Examiner* — Antonio B Crite
(74) *Attorney, Agent, or Firm* — JCIPRNET

(57) ABSTRACT

A display apparatus includes a driving substrate, a first light-emitting diode element, a first connection element, a second connection element, a first insulation pattern, and a reflective pattern. The driving substrate has a first pad, a second pad, a third pad, and a connection area. The first connection element is electrically connected to a first electrode of the first light-emitting diode element and the first pad of the driving substrate. The second connection element is electrically connected to a second electrode of the first light-emitting diode element and the second pad of the driving substrate. The first insulation pattern is disposed on the first light-emitting diode element, the first connection element, and the second connection element. The reflective pattern is disposed on the first insulation pattern.

17 Claims, 23 Drawing Sheets

(56) References Cited

U.S. PATENT DOCUMENTS

2019/0326480 A1   10/2019  You et al.
2020/0020672 A1 *  1/2020  Xi ..................... H01L 27/1214
2020/0312237 A1   10/2020  He et al.

FOREIGN PATENT DOCUMENTS

CN         109979981       7/2019
WO    WO-2020153191 A1 *  7/2020   ......... H01L 25/0753

* cited by examiner

DISPLAY APPARATUS

CROSS-REFERENCE TO RELATED APPLICATION

This application claims the priority benefits of U.S. provisional application Ser. No. 63/035,056, filed on Jun. 5, 2020 and Taiwan application serial no. 109130349, filed on Sep. 4, 2020. The entirety of each of the above-mentioned patent applications is hereby incorporated by reference herein and made a part of this specification.

BACKGROUND OF THE INVENTION

Field of the Invention

The invention relates to a display apparatus.

Description of Related Art

With the evolution of display techniques, display apparatuses with high resolution and thin profile are favored by the mainstream market. In recent years, due to the breakthrough in the process techniques of light-emitting diode (LED) elements, micro-LED display apparatuses or millimeter-grade light-emitting diode display apparatuses and the like for which LED elements may be manufactured in an array arrangement have been developed, wherein a liquid crystal layer and a color filter are not needed, so that the thickness of the display apparatuses may be further reduced. In addition, compared with organic light-emitting diode display apparatuses, micro light-emitting diode display apparatuses have the advantages of better power saving and longer life.

In the current manufacturing process of micro light-emitting diode display apparatuses, a large number of light-emitting diode elements need to be transferred onto another substrate by mass transfer. However, today's display apparatuses usually include millions of pixels, and the size of the light-emitting diode elements is small, so that the light-emitting diode elements are difficult to be accurately picked up and aligned. The light-emitting diode elements oftentimes may not be accurately placed in the predetermined position due to alignment error, thus causing the issue that the light-emitting diode elements may not be driven normally. That is to say, the current manufacturing yield of micro light-emitting diode display apparatuses is too low, so that repair is needed.

SUMMARY OF THE INVENTION

The invention provides a display apparatus with good performance that is easy repair.

A display apparatus of an embodiment of the invention includes a driving substrate, a first light-emitting diode element, a first connection element, a second connection element, a first insulation pattern, and a reflective pattern. The driving substrate has a first pad, a second pad, a third pad, and a connection region, wherein the first pad is disposed opposite to the second pad, the third pad is disposed opposite to the connection region, and the third pad is electrically connected to one of the first pad and the second pad. The first light-emitting diode element is disposed on the driving substrate and has a first electrode and a second electrode. The first connection element and the second connection element are disposed on a sidewall of the first light-emitting diode element, wherein the first connection element is electrically connected to the first electrode of the first light-emitting diode element and the first pad of the driving substrate, and the second connection element is electrically connected to the second electrode of the first light-emitting diode element and the second pad of the driving substrate. The first insulation pattern is disposed on the first light-emitting diode element, the first connection element, and the second connection element, wherein one of the first connection element and the second connection element is electrically connected to the third pad. The reflective pattern is disposed on the first insulation pattern. The reflective pattern includes a first portion and a second portion, wherein the first portion is electrically connected to another of the first connection element and the second connection element and extended from above the first light-emitting diode element onto the connection region of the driving substrate, and the second portion is electrically connected to the third pad of the driving substrate and structurally separated from the first portion of the reflective pattern.

In an embodiment of the invention, the first portion of the reflective pattern has an opening, and the second portion of the reflective pattern is disposed in the opening of the first portion.

In an embodiment of the invention, the driving substrate further has a connection line, wherein the connection line is electrically connected to the one of the first pad and the second pad and the third pad, the reflective pattern is overlapped with the connection line of the driving substrate, and the first insulation pattern is disposed on the connection line.

In an embodiment of the invention, the display apparatus further includes a first adhesive pattern. The first adhesive pattern is disposed on the driving substrate, wherein the first light-emitting diode element is disposed on the first adhesive pattern. The driving substrate further has a connection line, wherein the connection line is electrically connected to the one of the first pad and the second pad and the third pad, the reflective pattern is overlapped with the connection line of the driving substrate, and the first adhesive pattern is disposed on the connection line.

In an embodiment of the invention, the display apparatus further includes a second light-emitting diode element disposed on the driving substrate. The second light-emitting diode element has a first electrode and a second electrode, one of the first electrode and the second electrode of the second light-emitting diode element is disposed on the connection region of the driving substrate, and the first portion of the reflective pattern is electrically connected to the one of the first electrode and the second electrode of the second light-emitting diode element.

In an embodiment of the invention, the second portion of the reflective pattern is electrically connected to another of the first electrode and the second electrode of the second light-emitting diode element and the third pad of the driving substrate.

In an embodiment of the invention, a luminous efficiency of the second light-emitting diode element is higher than a luminous efficiency of the first light-emitting diode element.

In an embodiment of the invention, the display apparatus further includes an insulation pattern disposed on the driving substrate. The second insulation pattern has a first end and a second end opposite to each other, wherein the first end of the second insulation pattern is disposed on the connection region of the driving substrate, the first portion of the reflective pattern is disposed on the first end of the second insulation pattern, and the second portion of the reflective pattern is disposed on the second end of the second insulation pattern.

In an embodiment of the invention, a material of the second insulation pattern is the same as a material of the first insulation pattern.

In an embodiment of the invention, the display apparatus further includes a second light-emitting diode element disposed on the second insulation pattern. The second light-emitting diode element has a first electrode and a second electrode, one of the first electrode and the second electrode of the second light-emitting diode element is disposed on the connection region of the driving substrate, and the first portion of the reflective pattern is electrically connected to the one of the first electrode and the second electrode of the second light-emitting diode element.

In an embodiment of the invention, the display apparatus further includes a second light-emitting diode element disposed on the second insulation pattern. The second light-emitting diode element has a first electrode and a second electrode, one of the first electrode and the second electrode of the second light-emitting diode element is disposed on the connection region of the driving substrate, and the first portion of the reflective pattern is electrically connected to the one of the first electrode and the second electrode of the second light-emitting diode element.

In an embodiment of the invention, the display apparatus further includes a second light-emitting diode element disposed on the second insulation pattern. The second light-emitting diode element has a first electrode and a second electrode, one of the first electrode and the second electrode of the second light-emitting diode element is disposed on the connection region of the driving substrate, and the first portion of the reflective pattern is electrically connected to the one of the first electrode and the second electrode of the second light-emitting diode element. A refractive index of the second insulation pattern is between a refractive index of a portion of the second light-emitting diode element and a refractive index of a portion of the driving substrate.

In an embodiment of the invention, the display apparatus further includes a second light-emitting diode element disposed on the second insulation pattern. The second light-emitting diode element has a first electrode and a second electrode, one of the first electrode and the second electrode of the second light-emitting diode element is disposed on the connection region of the driving substrate, and the first portion of the reflective pattern is electrically connected to the one of the first electrode and the second electrode of the second light-emitting diode element. A distance between the second light-emitting diode element and a base of the driving substrate is greater than a distance between the first light-emitting diode element and the base of the driving substrate, and a distance between the second portion of the reflective pattern on another of the first electrode and the second electrode of the second light-emitting diode element and the base of the driving substrate is less than a distance between the first portion of the reflective pattern located on an upper surface of the first insulation pattern and the base of the driving substrate, wherein the upper surface of the first insulation pattern faces away from the base of the driving substrate.

In an embodiment of the invention, a film thickness of the reflective pattern is greater than a film thickness of at least one of the first connection element and the second connection element.

In an embodiment of the invention, the first insulation pattern has an upper surface facing away from the driving substrate, and the upper surface of the first insulation pattern is substantially a flat surface.

In an embodiment of the invention, the first connection element and the second connection element have a first gap on the first light-emitting diode element, the first portion of the reflective pattern and the second portion of the reflective pattern have a second gap located on the connection region, the first gap and the second gap respectively have a first width and a second width in a same direction, and the second width is less than the first width.

In an embodiment of the invention, the first light-emitting diode element has an upper surface facing away from the driving substrate, a region of the upper surface is located between the first connection element and the second connection element, and the reflective pattern is overlapped with the region of the upper surface of the first light-emitting diode element, the first connection element, and the second connection element.

A display apparatus of an embodiment of the invention includes a driving substrate, a first light-emitting diode element, a first connection element, a second connection element, a first insulation pattern, and a reflective pattern. The driving substrate has a first pad, a second pad, a third pad, and a connection region, wherein the first pad is disposed opposite to the second pad, the third pad is disposed opposite to the connection region, and the third pad is electrically connected to one of the first pad and the second pad. The first light-emitting diode element is disposed on the driving substrate and has a first electrode and a second electrode. The first connection element and the second connection element are disposed on a sidewall of the first light-emitting diode element, wherein the first connection element is electrically connected to the first electrode of the first light-emitting diode element and the first pad of the driving substrate, and the second connection element is electrically connected to the second electrode of the first light-emitting diode element and the second pad of the driving substrate. The first insulation pattern is disposed on the first light-emitting diode element, the first connection element, and the second connection element. The reflective pattern is disposed on the first insulation pattern. The first light-emitting diode element has an upper surface facing away from the driving substrate, a region of the upper surface is located between the first connection element and the second connection element, and the reflective pattern is overlapped with the region of the upper surface of the first light-emitting diode element, the first connection element, and the second connection element.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
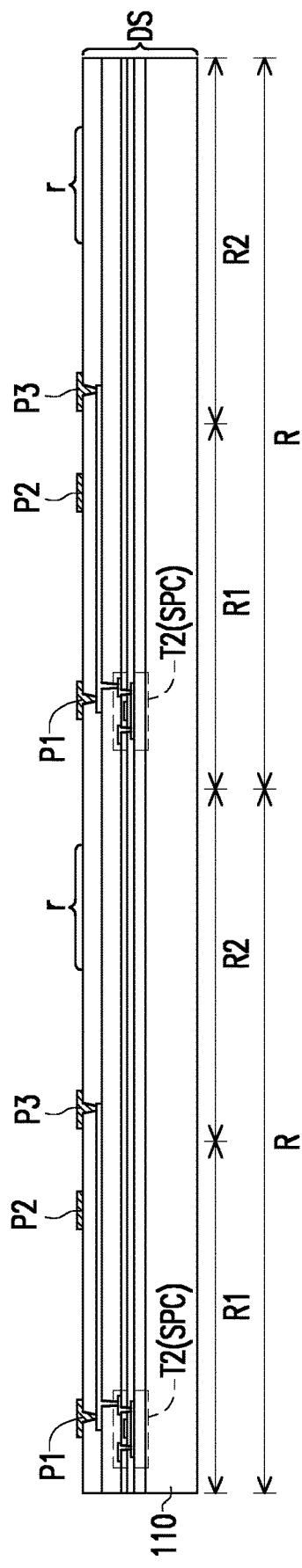
FIG. 1A to FIG. 1F are side views and perspective schematic diagrams of the manufacturing process of a display apparatus 10 of an embodiment of the invention.

Hereinafter, exemplary embodiments of the invention are described in detail, and examples of the exemplary embodiments are conveyed via the figures. Wherever possible, the same reference numerals are used in the figures and the descriptions to refer to the same or similar portions.

It should be understood that, when a layer, film, region, or an element of a substrate is "on" another element or "connected to" another element, the element may be directly on the other element or connected to the other element, or an intermediate element may also be present. On the other hand, when an element is "directly on another element" or "directly connected to" another element, an intermediate element is not present. As used in the present specification, "connected to" may refer to a physical and/or electrical connection. Furthermore, "electrically connected" or "coupled" may mean that other elements are present between two elements.

"About", "similar", or "substantially" used in the present specification include the value and the average value within an acceptable deviation range of a specific value confirmed by those having ordinary skill in the art, and the concerned measurement and a specific quantity (i.e., limitations of the measuring system) of measurement-related errors are taken into consideration. For instance, "about" may represent within one or a plurality of standard deviations of the value, or within ±30%, ±20%, ±10%, or ±5%. Moreover, "about", "similar", or "substantially" used in the present specification may include a more acceptable deviation range or standard deviation according to optical properties, etching properties, or other properties, and one standard deviation does not need to apply to all of the properties.

Unless otherwise stated, all of the terminology used in the present specification (including technical and scientific terminology) have the same definition as those commonly understood by those skilled in the art of the invention. It should be further understood that, terminology defined in commonly-used dictionaries should be interpreted to have the same definitions in related art and in the entire specification of the invention, and are not interpreted as ideal or overly-formal definitions unless clearly stated as such in the present specification.

FIG. 1A to FIG. 1F are side views and perspective schematic diagrams of the manufacturing process of a display apparatus 10 of an embodiment of the invention.

Figure 2:
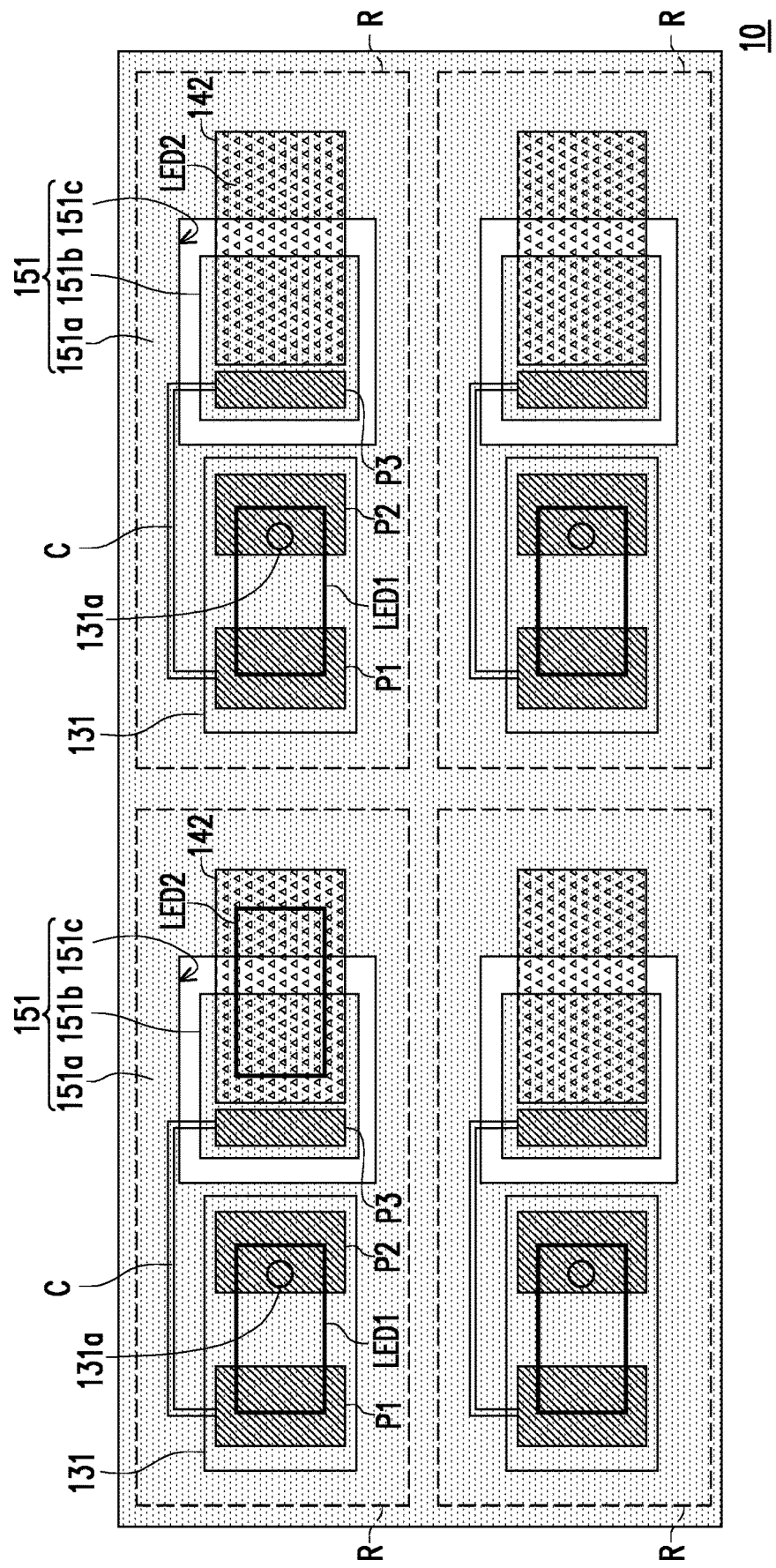
FIG. 2 is a top view and a perspective schematic diagram of the display apparatus 10 of an embodiment of the invention.

FIG. 2 is a top view and a perspective schematic diagram of the display apparatus 10 of an embodiment of the invention.

Figure 1B:
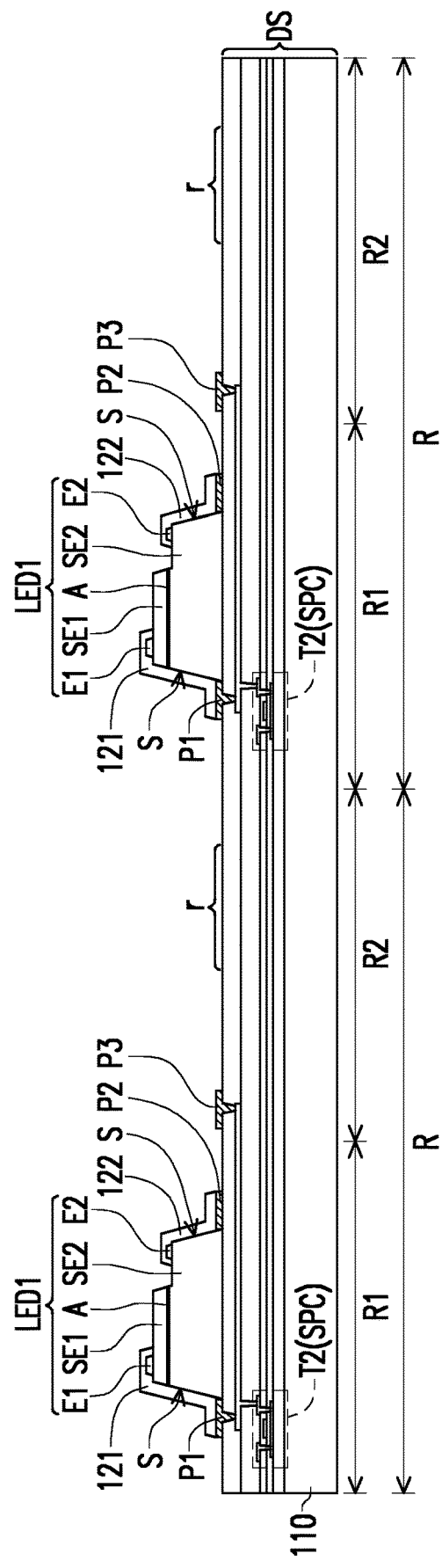
Figure 1C:
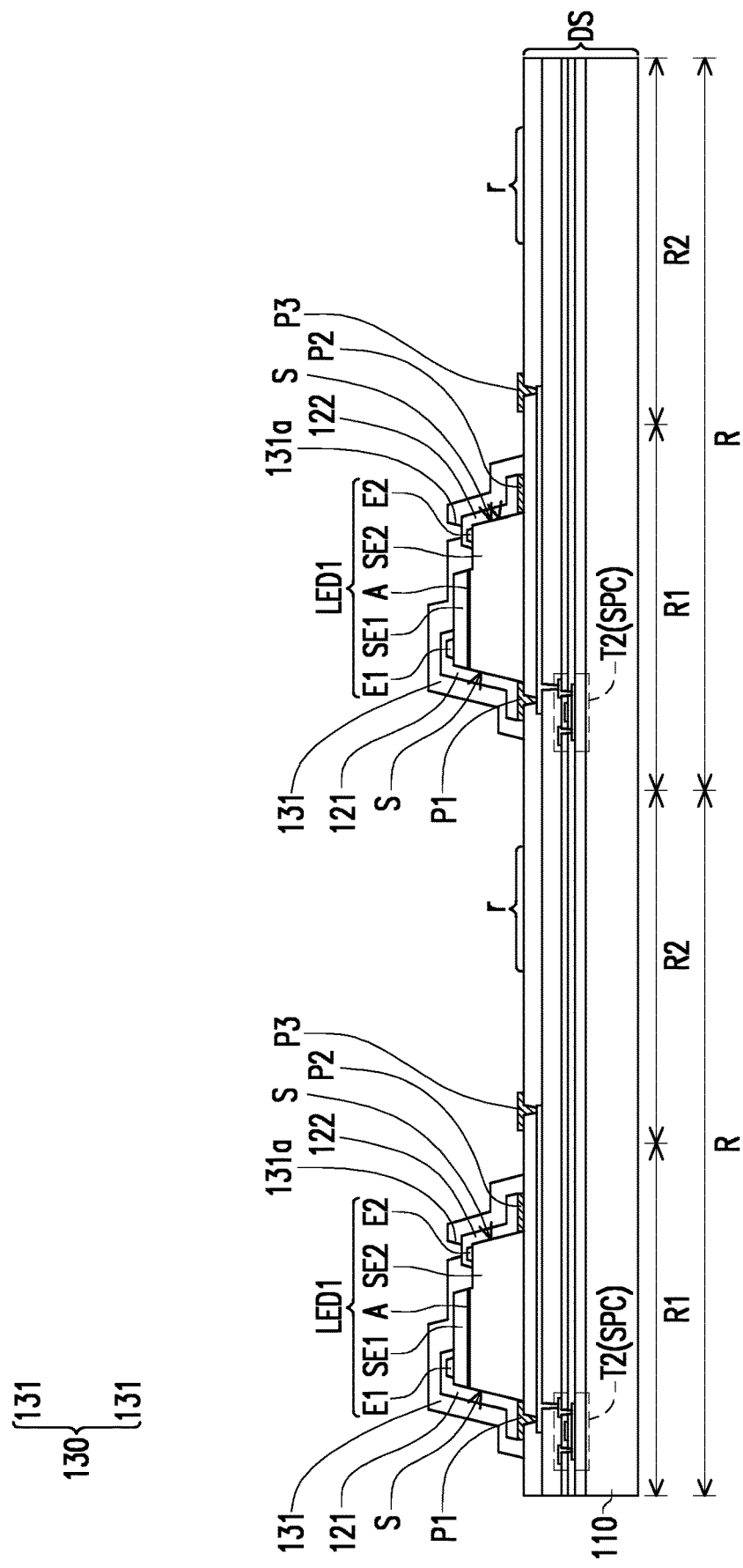
Figure 1D:
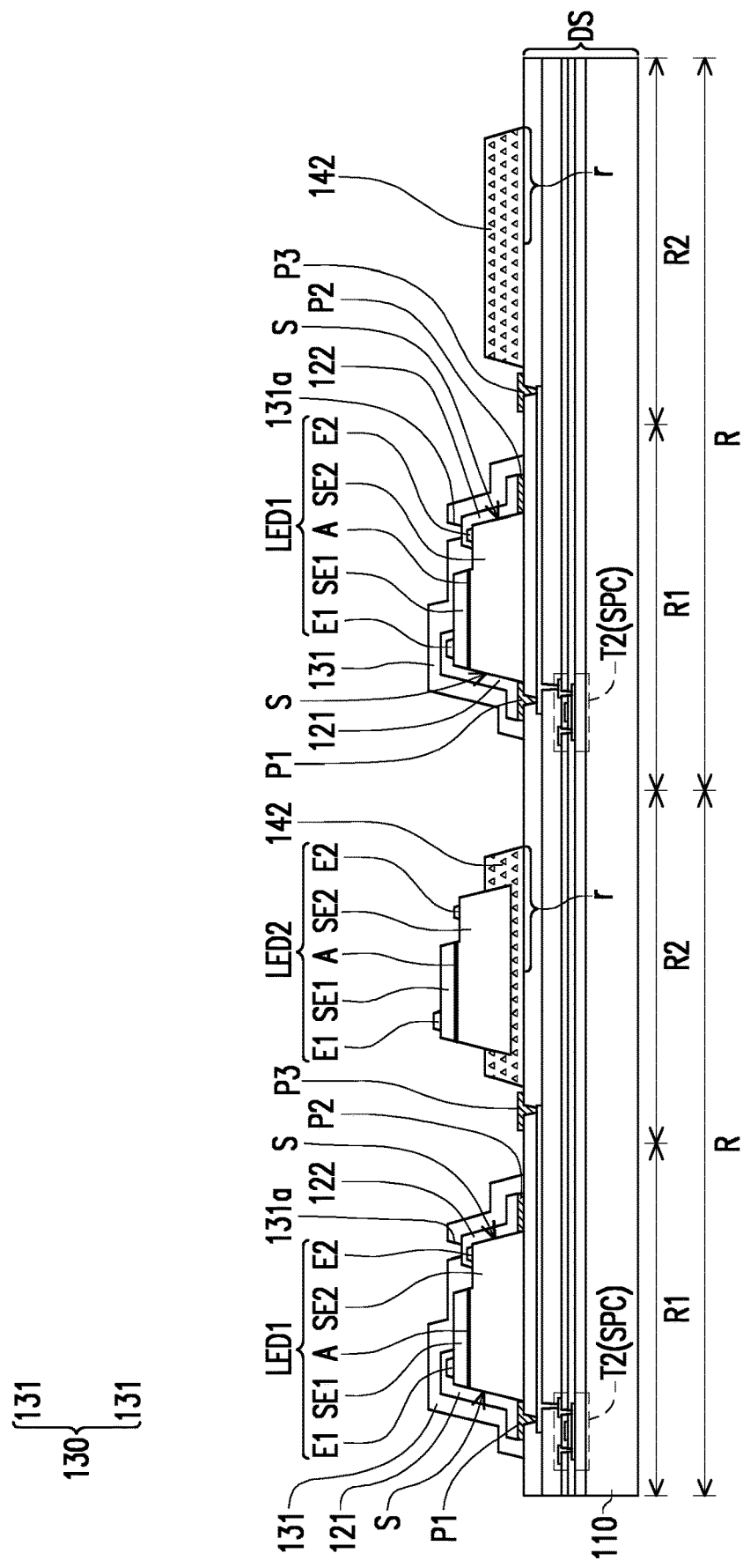
Figure 1E:
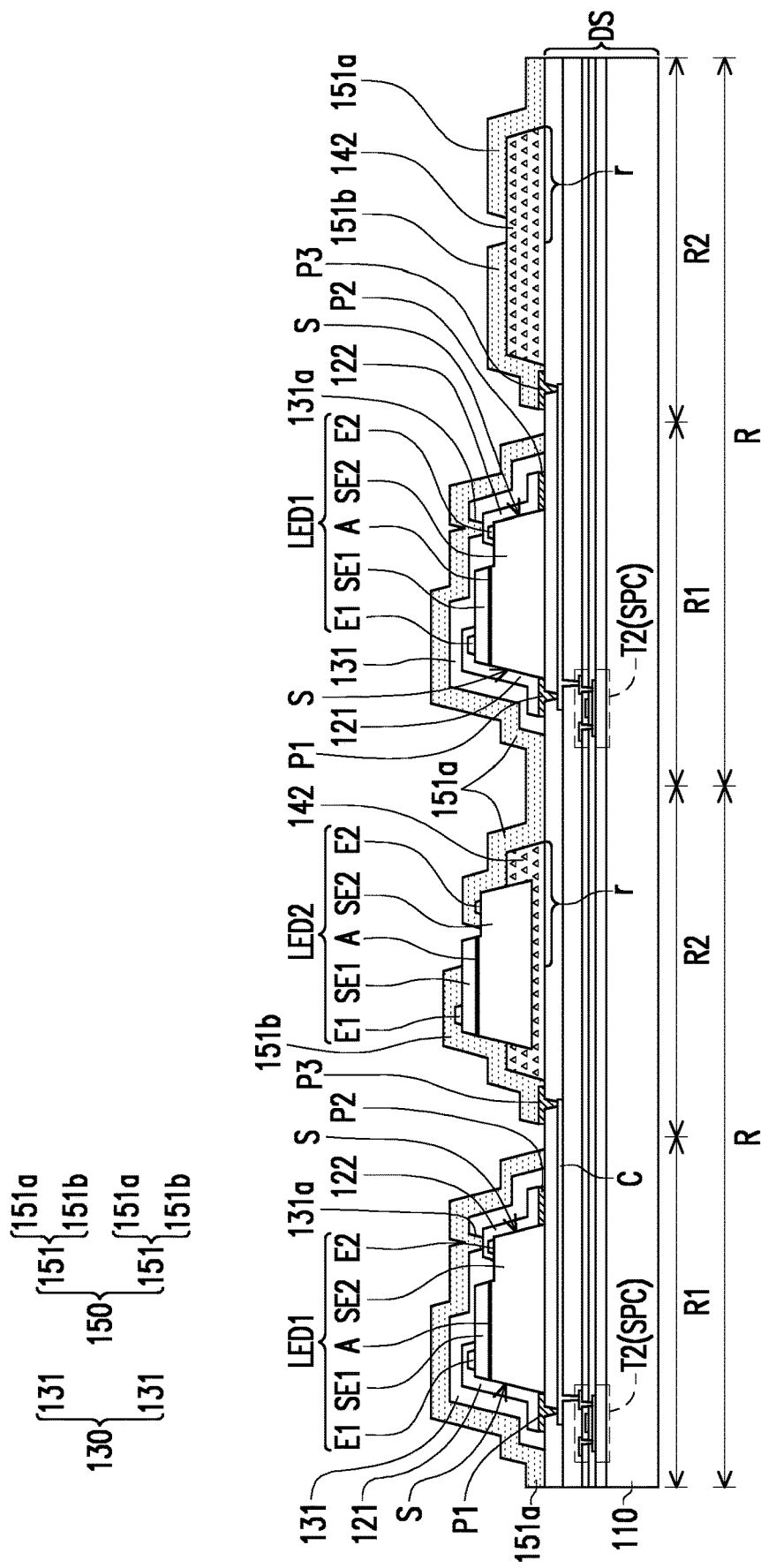
Figure 1F:
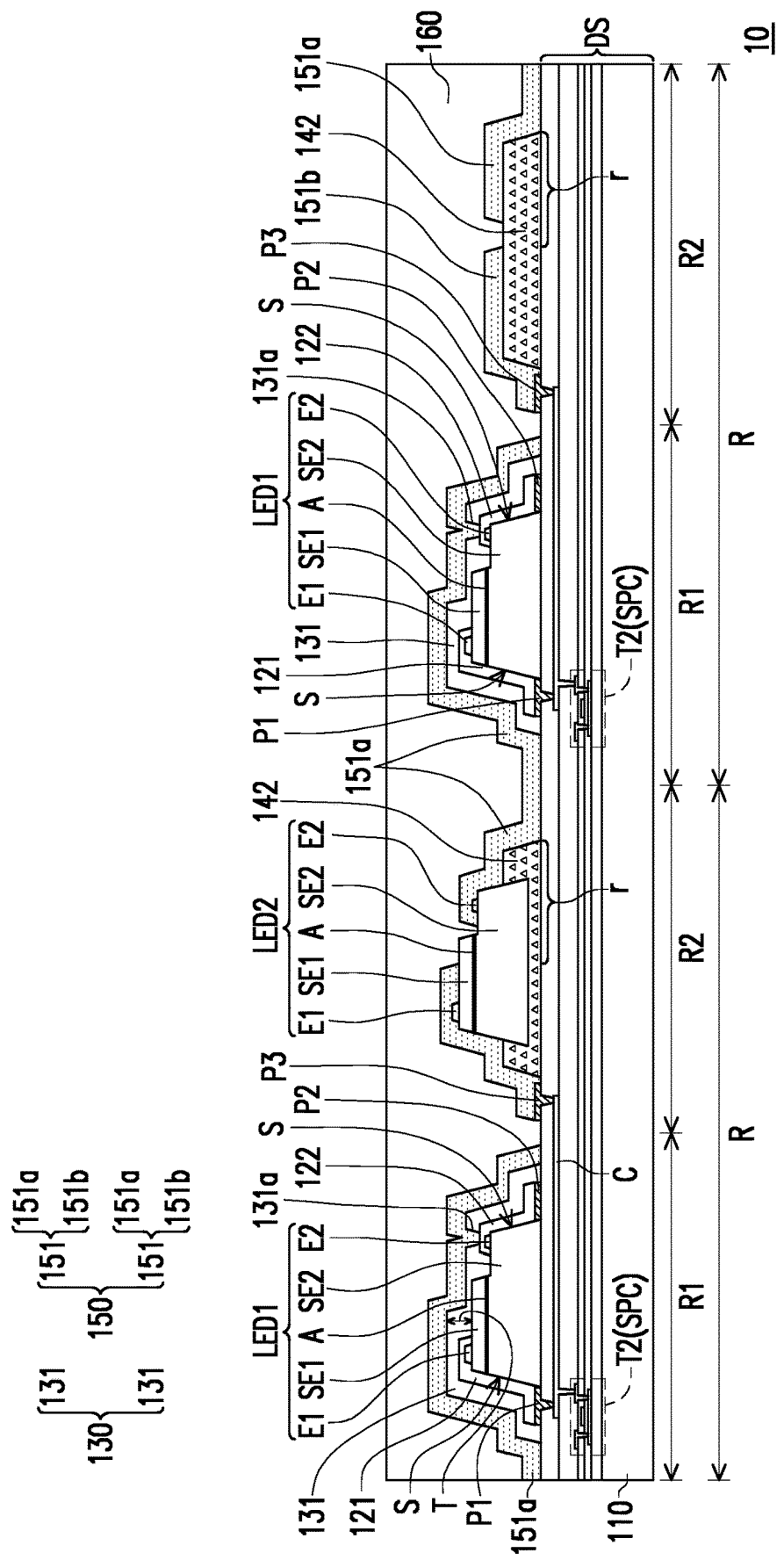

FIG. 2 shows a plurality of first pads P1, a plurality of second pads P2, a plurality of third pads P3, a plurality of connection lines C, a plurality of first light-emitting diode elements LED1, a plurality of first insulation patterns 131, a plurality of contacts 131a, a plurality of second adhesive patterns 142, a second light-emitting diode element LED2, and a plurality of reflective patterns 151 of FIG. 1F and omits the other members of FIG. 1F.

Figure 3:
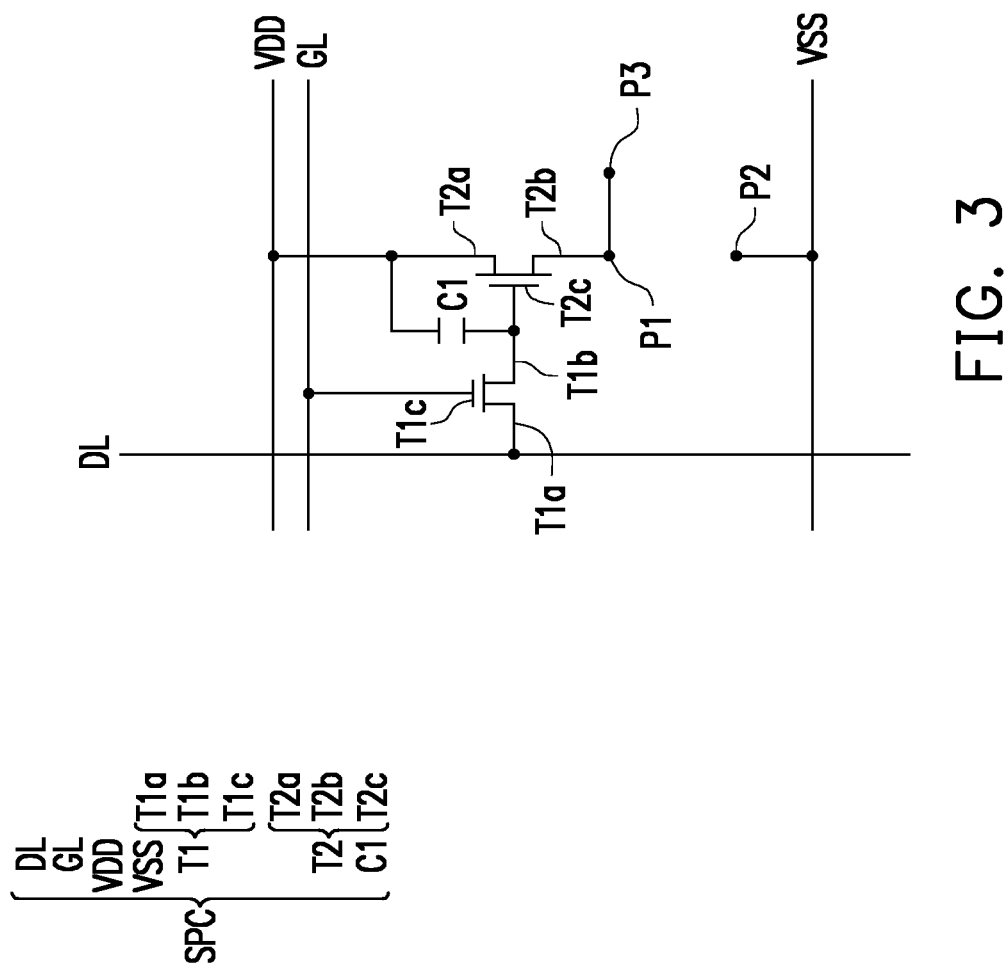
FIG. 3 schematically shows an equivalent circuit of a pixel driving circuit SPC of an embodiment of the invention.

FIG. 3 schematically shows an equivalent circuit of a pixel driving circuit SPC of an embodiment of the invention.

FIG. 1A to FIG. 1F, FIG. 2, and FIG. 3 show the manufacturing process and structure of the display apparatus 10 of an embodiment of the invention.

Please refer to FIG. 1A and FIG. 2. First, a driving substrate DS is provided. The driving substrate DS has a plurality of pixel regions R. Each of the pixel regions R of the driving substrate DS includes a first sub-region R1 and a second sub-region R2 adjacent to each other. The first sub-region R1 has a first pad P1 and a second pad P2 disposed opposite to each other, the second sub-region R2 has a third pad P3 and a connection region r disposed opposite to each other, the first sub-region R1 is used for disposing a first light-emitting diode element LED1 transferred for the first time, and the second sub-region R2 is used for disposing a second light-emitting diode element LED2 for repair.

The third pad P3 of each of the pixel regions R is electrically connected to one of the first pad P1 and the second pad P2 of the pixel region R. For example, in the present embodiment, the third pad P3 of each of the pixel regions R may be optionally electrically connected to the first pad P1 of the pixel region R, but the invention is not limited thereto.

Referring to FIG. 1A and FIG. 3, in the present embodiment, the driving substrate DS also includes a base 110 and a plurality of pixel driving circuits SPC disposed on the base 110, wherein the first pad P1, the second pad P2, and the third pad P3 of each of the pixel regions R are electrically connected to one corresponding pixel driving circuit SPC.

In the present embodiment, the display apparatus 10 is a bottom-emitting display, and the base 110 of the driving substrate DS is light-transmissive. For example, in the present embodiment, the material of the base 110 may be glass, quartz, organic polymer, or other applicable materials.

In the present embodiment, each of the pixel driving circuits SPC may include a data line DL, a scan line GL, a power line VDD, a common line VSS, a first transistor T1, a second transistor T2, and a capacitor C1, wherein a first end T1a of the first transistor T1 is electrically connected to the data line DL, a control end T1c of the first transistor T1 is electrically connected to the scan line GL, a second end T1b of the first transistor T1 is electrically connected to a control end T2c of the second transistor T2, a first end T2a of the second transistor T2 is electrically connected to the power line VDD, and the capacitor C1 is electrically connected to the second end T1b of the first transistor T1 and the first end T2a of the second transistor T2.

In the present embodiment, the first pad P1 and the second pad P2 of each of the pixel regions R may be respectively electrically connected to the second end T2*b* of the second transistor T2 and the common line VSS of one corresponding pixel driving circuit SPC, and the third pad P3 of each of the pixel regions R may be electrically connected to the second end T2*b* of the second transistor T2 or the common line VSS of one corresponding pixel driving circuit SPC. For example, in the present embodiment, the third pad P3 of each of the pixel regions R may be electrically connected to the second end T2*b* of the second transistor T2 of one corresponding pixel driving circuit SPC, but the invention is not limited thereto.

In the present embodiment, one pixel driving circuit SPC may optionally include two transistors (the first transistor T1 and the second transistor T2) and one capacitor C1. In other words, in the present embodiment, the pixel driving circuit SPC may optionally adopt a 2T1C architecture. However, the invention is not limited thereto, and in other embodiments, the pixel driving circuit SPC may also adopt other architectures, such as but not limited to: a 1T1C architecture, a 3T1C architecture, a 3T2C architecture, a 4T1C architecture, a 4T2C architecture, a 5T1C architecture, a 5T2C architecture, a 6T1C architecture, a 6T2C architecture, a 7T2C architecture, or any other possible architecture.

Please refer to FIG. 1B. Next, the plurality of first light-emitting diode elements LED1 are transferred to the plurality of first sub-regions R1 of the plurality of pixel regions R of the driving substrate DS. Each of the first light-emitting diode elements LED1 is disposed on the driving substrate DS, and has a first electrode E1 and a second electrode E2. The first electrode E1 of the first light-emitting diode element LED1 and the second electrode E2 of the first light-emitting diode element LED1 are respectively electrically connected to a first-type semiconductor layer SE1 of the first light-emitting diode element LED1 and a second-type semiconductor layer SE2 of the first light-emitting diode element LED1, and an active layer A of the first light-emitting diode element LED1 is disposed between the first-type semiconductor layer SE1 and the second-type semiconductor layer SE2.

For example, in the present embodiment, each of the first light-emitting diode elements LED1 may be fixed on the driving substrate DS by a first adhesive pattern (not shown) provided on the bottom surface thereof, but the invention is not limited thereto.

Referring to FIG. 1B, next, a plurality of first connection elements 121 and a plurality of second connection elements 122 are formed so that the plurality of first light-emitting diode elements LED1 are electrically connected to the plurality of first pads P1 and the plurality of second pads P2 of the plurality of pixel regions R, respectively. Each of the first connection elements 121 and one corresponding second connection element 122 are disposed on a sidewall S of the same first light-emitting diode element LED1, wherein the first connection element 121 and the second connection element 122 are respectively electrically connected to the first electrode E1 and the second electrode E2 of the same first light-emitting diode element LED1, the first connection element 121 and the second connection element 122 are also electrically connected to the first pad P1 and the second pad P2 in the same pixel region R, respectively, and one of the first connection element 121 and the second connection element 122 is electrically connected to the third pad P3 of the same pixel region R. For example, in the present embodiment, the first connection element 121 may be optionally electrically connected to the third pad P3, but the invention is not limited thereto.

Referring to FIG. 1C and FIG. 2, then, an insulation layer 130 is formed on the plurality of first light-emitting diode elements LED1, the plurality of first connection elements 121, and the plurality of second connection elements 122. The insulation layer 130 includes a plurality of first insulation patterns 131, wherein each of the first insulation patterns 131 is disposed on one corresponding first light-emitting diode element LED1, one corresponding first connection element 121, and one corresponding second connection element 122.

In the present embodiment, each of the first insulation patterns 131 may optionally have a contact 131*a*, wherein the contact 131*a* is overlapped with one of the first connection element 121 and the second connection element 122 located on the same first light-emitting diode element LED1. For example, in the present embodiment, the contacts 131*a* of the first insulating patterns 131 may be optionally overlapped with the second connection elements 122, but the invention is not limited thereto.

In the present embodiment, the material of the insulation layer 130 may optionally be an inorganic material, such as but not limited to: silicon oxide, silicon nitride, silicon oxynitride, or stacked layers of at least two of the above materials. However, the invention is not limited thereto. In other embodiments, the material of the insulation layer 130 may also be an organic material, or a combination of an organic material and an inorganic material.

Please refer to FIG. 1C and FIG. 2. Whether the plurality of first light-emitting diode elements LED1 may be driven by the driving substrate DS to normally emit light is detected. If it is found that the first light-emitting diode element LED1 on a pixel region R may not be driven by the driving substrate DS to normally emit light, a repair operation is performed on the second sub-region R2 of the pixel region R.

Referring to FIG. 1D and FIG. 2, for example, in the present embodiment, a lithography process may be optionally used to form a plurality of second adhesive patterns 142, wherein the plurality of second adhesive patterns 142 are respectively disposed on the plurality of second sub-regions R2 of the plurality of pixel regions R.

In the present embodiment, an adhesive material layer (not shown) is patterned using a pre-designed photomask to form the plurality of second adhesive patterns 142. Therefore, regardless of whether the pixel regions R need to be repaired, the second adhesive patterns 142 are provided on the plurality of second sub-regions R2 of all of the plurality of pixel regions R. However, the invention is not limited thereto. In other embodiments, the second adhesive patterns 142 may also be formed in other ways, and the second sub-region R2 of each of the pixel regions R is not necessarily provided with the second adhesive pattern 142.

Please refer to FIG. 1D and FIG. 2. In the present embodiment, next, the second light-emitting diode element LED2 is transferred onto the second adhesive pattern 142. The first electrode E1 of the second light-emitting diode element LED2 and the second electrode E2 of the second light-emitting diode element LED2 are respectively electrically connected to the first-type semiconductor layer SE1 of the second light-emitting diode element LED2 and the second-type semiconductor layer SE2 of the second light-emitting diode element LED2, and the active layer A of the second light-emitting diode element LED2 is disposed between the first-type semiconductor layer SE1 and the second-type semiconductor layer SE2.

Referring to FIG. 1E and FIG. 2, then, a reflective layer 150 is formed on the insulation layer 130. The reflective layer 150 includes a plurality of reflective patterns 151 respectively disposed at the plurality of pixel regions R. Each of the reflective patterns 151 is disposed on a corresponding first insulation pattern 131. Each of the reflective patterns 151 includes a first portion 151a and a second portion 151b, one of the first connection element 121 and the second connection element 122 (for example, but not limited to: the first connection element 121) is electrically connected to the third pad P3 via a connection line C, the other of the first connection element 121 and the second connection element 122 (for example, but not limited to: the second connection element 122) is not electrically connected to the third pad P3 via the connection line C, the first portion 151a of the reflective pattern 151 is electrically connected to the other of the first connection element 121 and the second connection element 122 (for example, but not limited to: the second connection element 122) and is extended from above the first light-emitting diode element LED1 onto the connection region r of the driving substrate DS, and the second portion 151b of the reflective pattern 151 is electrically connected to the third pad P3 of the driving substrate DS and is structurally separated from the first portion 151a of the reflective pattern 151.

In the present embodiment, the first portion 151a of the reflective pattern 151 has an opening 151c, and the second portion 151b of the reflective pattern 151 is disposed in the opening 151c of the first portion 151a. In the present embodiment, the opening 151c of the reflective pattern 151 is, for example, a closed opening, but the invention is not limited thereto.

Referring to FIG. 1E and FIG. 2, in the repaired pixel region R (for example: the pixel region R on the left side of FIG. 1E and the pixel region R on the upper left corner of FIG. 2), one of the first electrode E1 and the second electrode E2 (for example, but not limited to: the second electrode E2) of the second light-emitting diode element LED2 is disposed on the connection region r of the driving substrate DS, the first portion 151a of the reflective pattern 151 is electrically connected to the one of the first electrode E1 and the second electrode E2 (for example, but not limited to: the second electrode E2) of the second light-emitting diode element LED2, and the second portion 151b of the reflective pattern 151 is electrically connected to the other of the first electrode E1 and the second electrode E2 (for example, but not limited to: the first electrode E1) of the second light-emitting diode element LED2 and the third pad P3 of the driving substrate DS.

In other words, in the repaired pixel region R, in addition to reflecting light beams (not shown) emitted by the first light-emitting diode element LED1 and the second light-emitting diode element LED2, the first portion 151a of the reflective pattern 151 may also be used as a conductive path in which an electrode (for example, but not limited to: the second electrode E2) of the second light-emitting diode element LED2 is electrically connected to the driving substrate DS; in addition to reflecting a light beam (not shown) emitted by the second light-emitting diode element LED2, the second portion 151b of the reflective pattern 151 may also be used as a conductive path in which the other electrode (for example, but not limited to: the first electrode E1) of the second light-emitting diode element LED2 is electrically connected to the driving substrate DS.

In the present embodiment, in the unrepaired pixel region R (for example: the pixel region R on the right side of FIG. 1E and the pixel region R on the upper right corner of FIG. 2), the first portion 151a of the reflective pattern 151 is extended from above the first insulation pattern 131 onto a first end 142a of the second adhesive pattern 142, and the second portion 151b of the reflective pattern 151 may be disposed on a second end 142b of the second adhesive pattern 142, but the invention is not limited thereto.

Referring to FIG. 1E and FIG. 2, then, a flat layer 160 is formed on the reflective layer 150 to cover the first light-emitting diode elements LED1 and the second light-emitting diode element LED2 on the plurality of pixel regions R. At this point, the display apparatus 10 is completed.

It should be mentioned here that, the following embodiments adopt the reference numerals of the embodiment above and a portion of the content thereof, wherein the same reference numerals are used to represent the same or similar devices and descriptions of the same technical content are omitted. The omitted portions are as described in the embodiment above and are not repeated in the embodiments below.

FIG. 4A to FIG. 4F are side views and perspective schematic diagrams of the manufacturing process of a display apparatus 10A of an embodiment of the invention.

Figure 5:
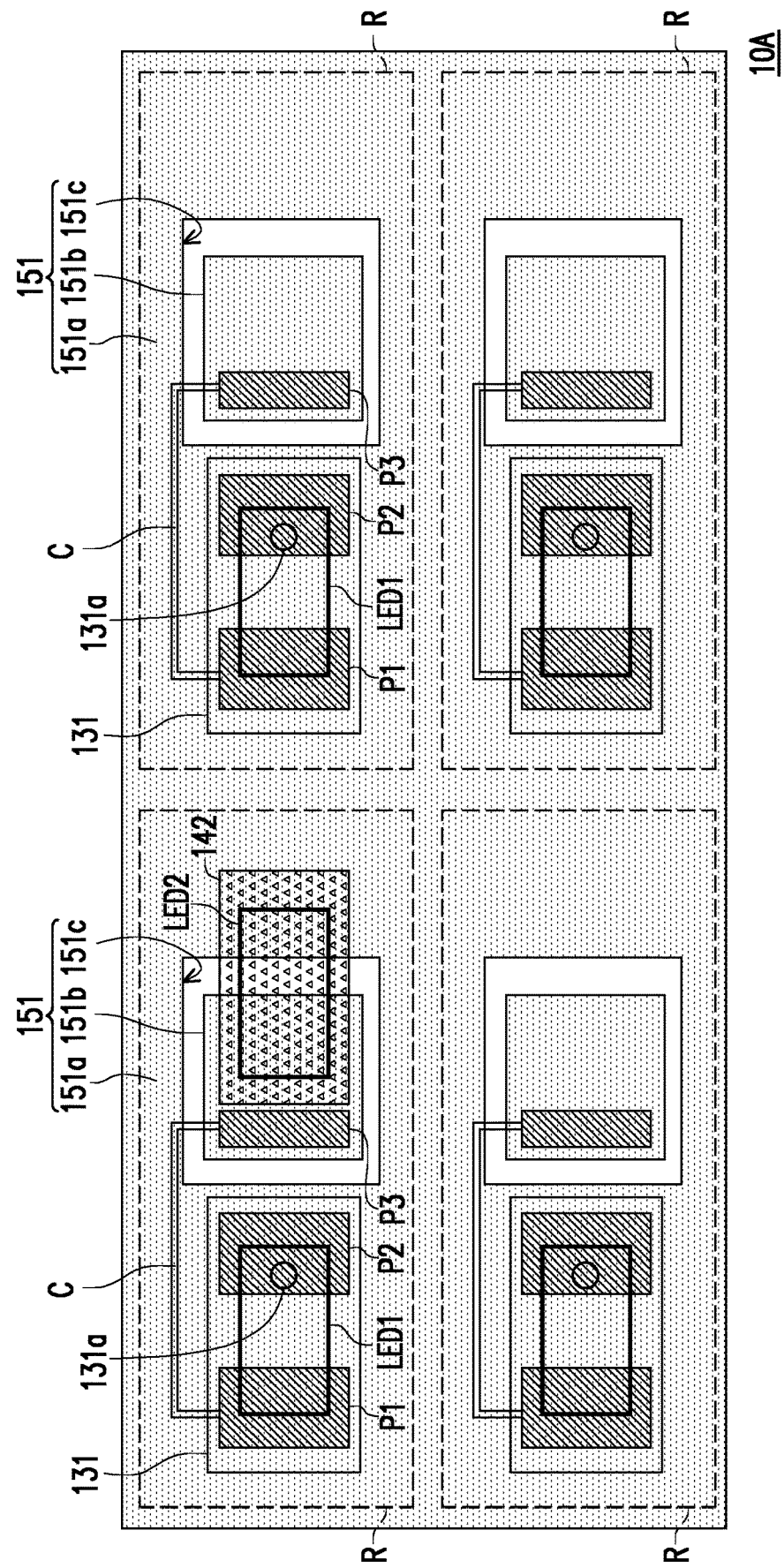
FIG. 5 is a top view and a perspective schematic diagram of the display apparatus 10A of an embodiment of the invention.

FIG. 5 is a top view and a perspective schematic diagram of the display apparatus 10A of an embodiment of the invention.

Figure 4A:
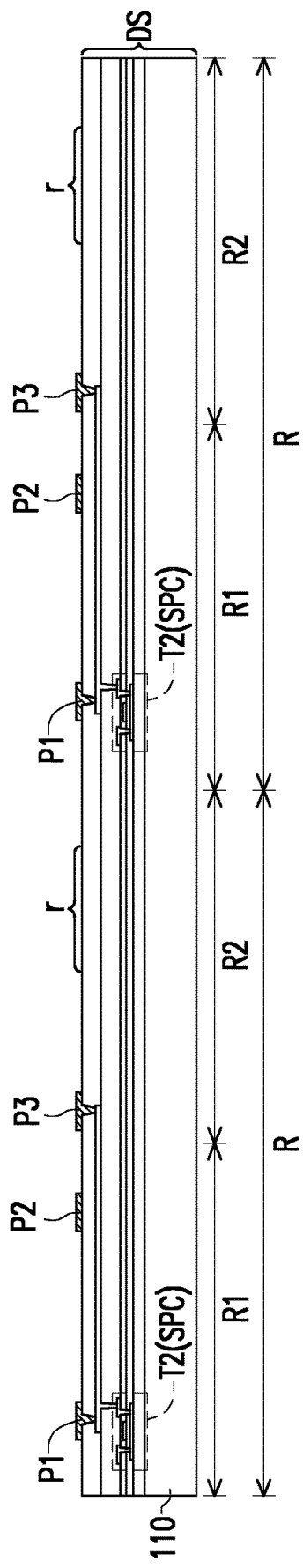
FIG. 4A to FIG. 4F are side views and perspective schematic diagrams of the manufacturing process of a display apparatus 10A of an embodiment of the invention.
Figure 4B:
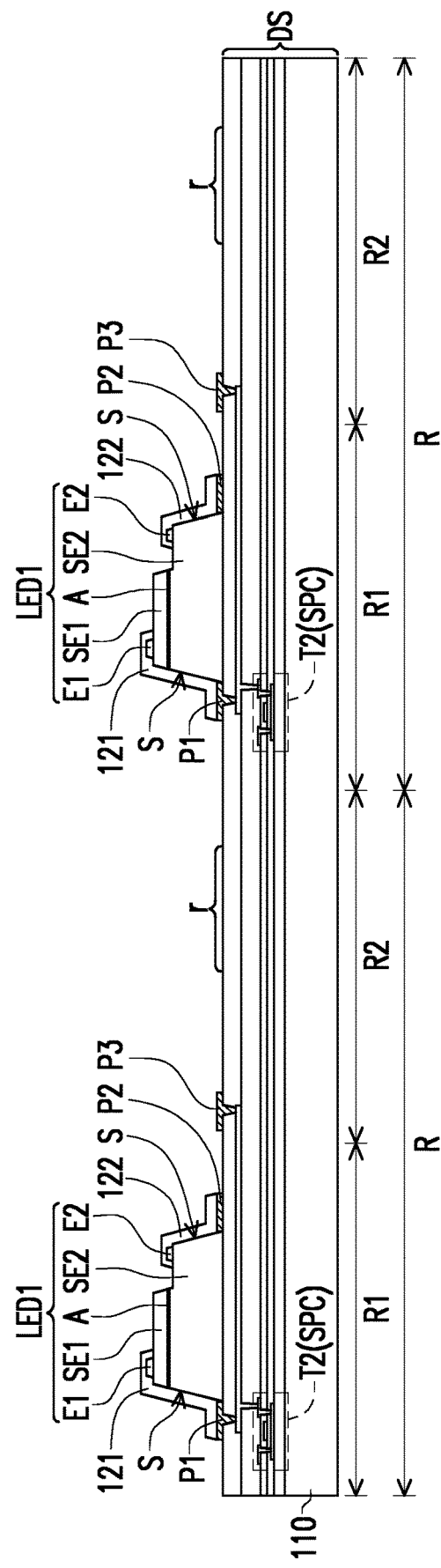
Figure 4C:
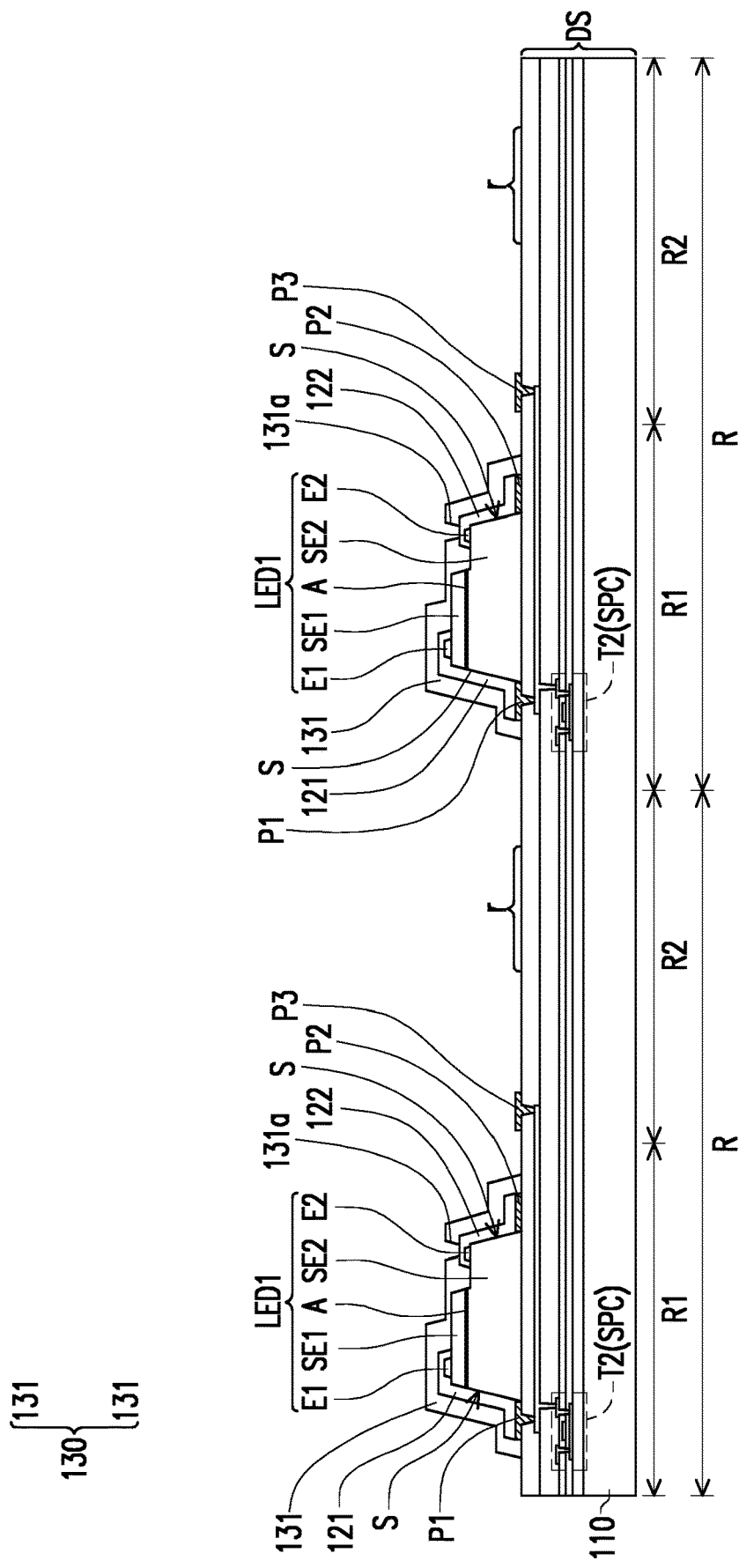
Figure 4D:
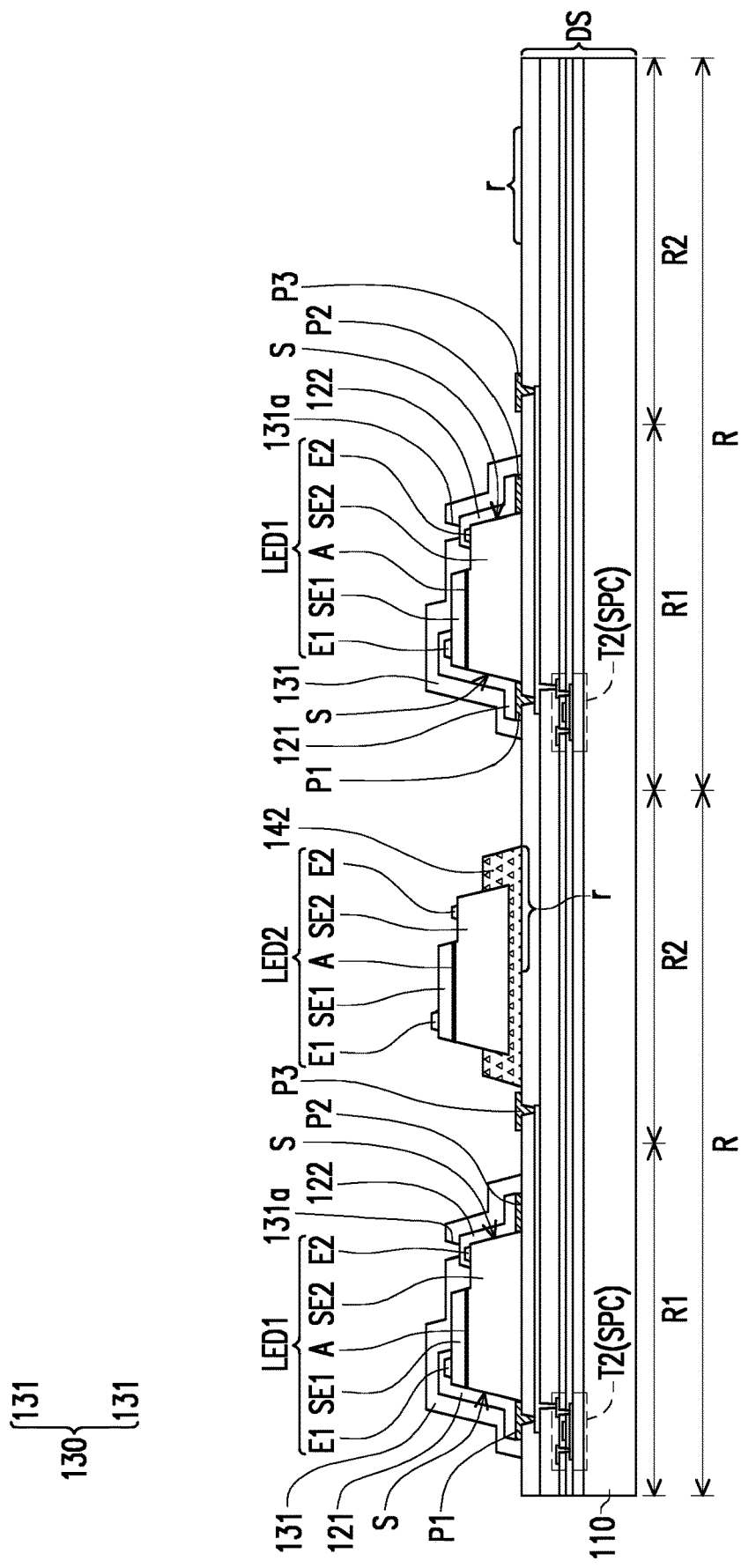
Figure 4E:
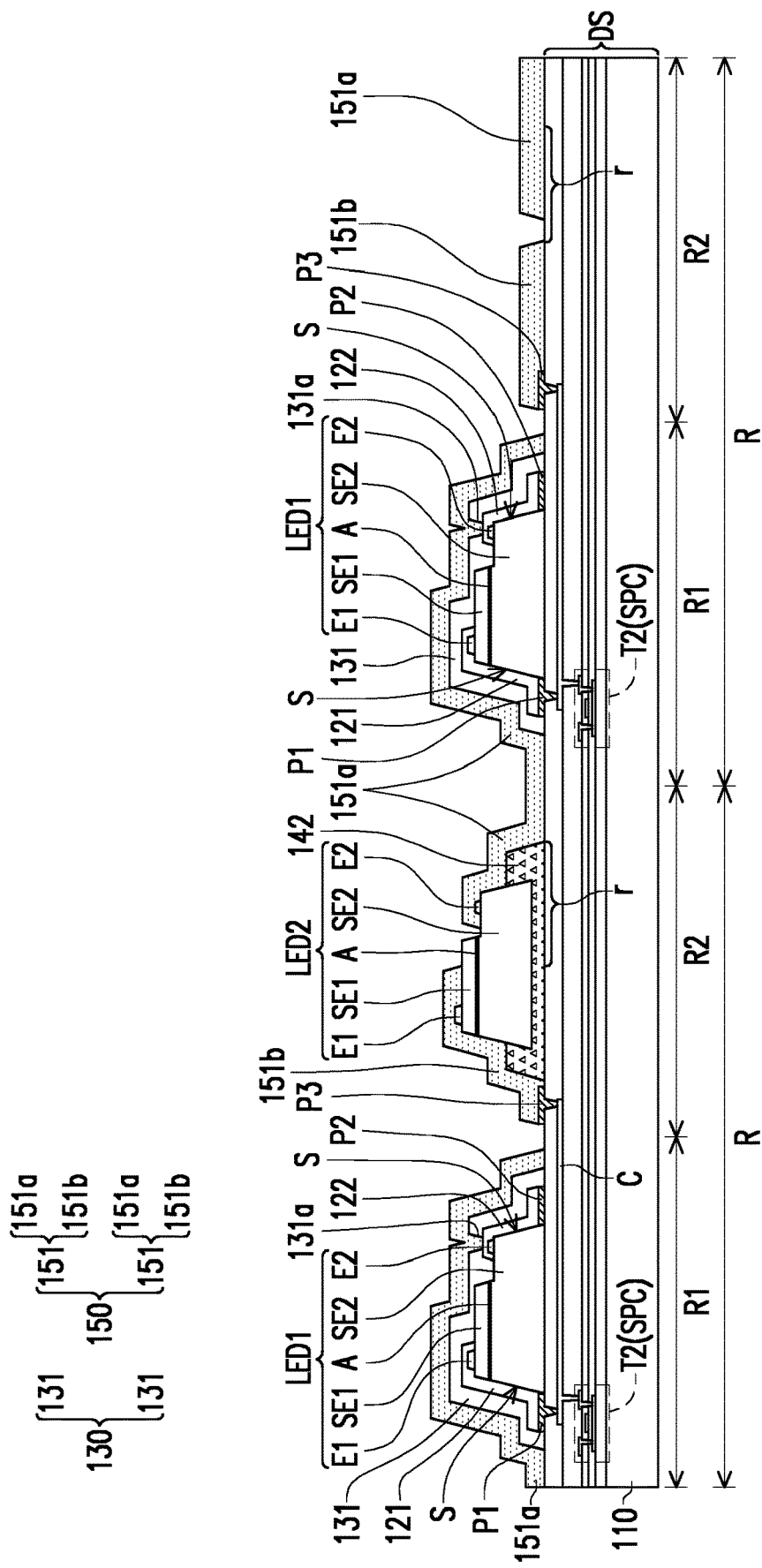
Figure 4F:
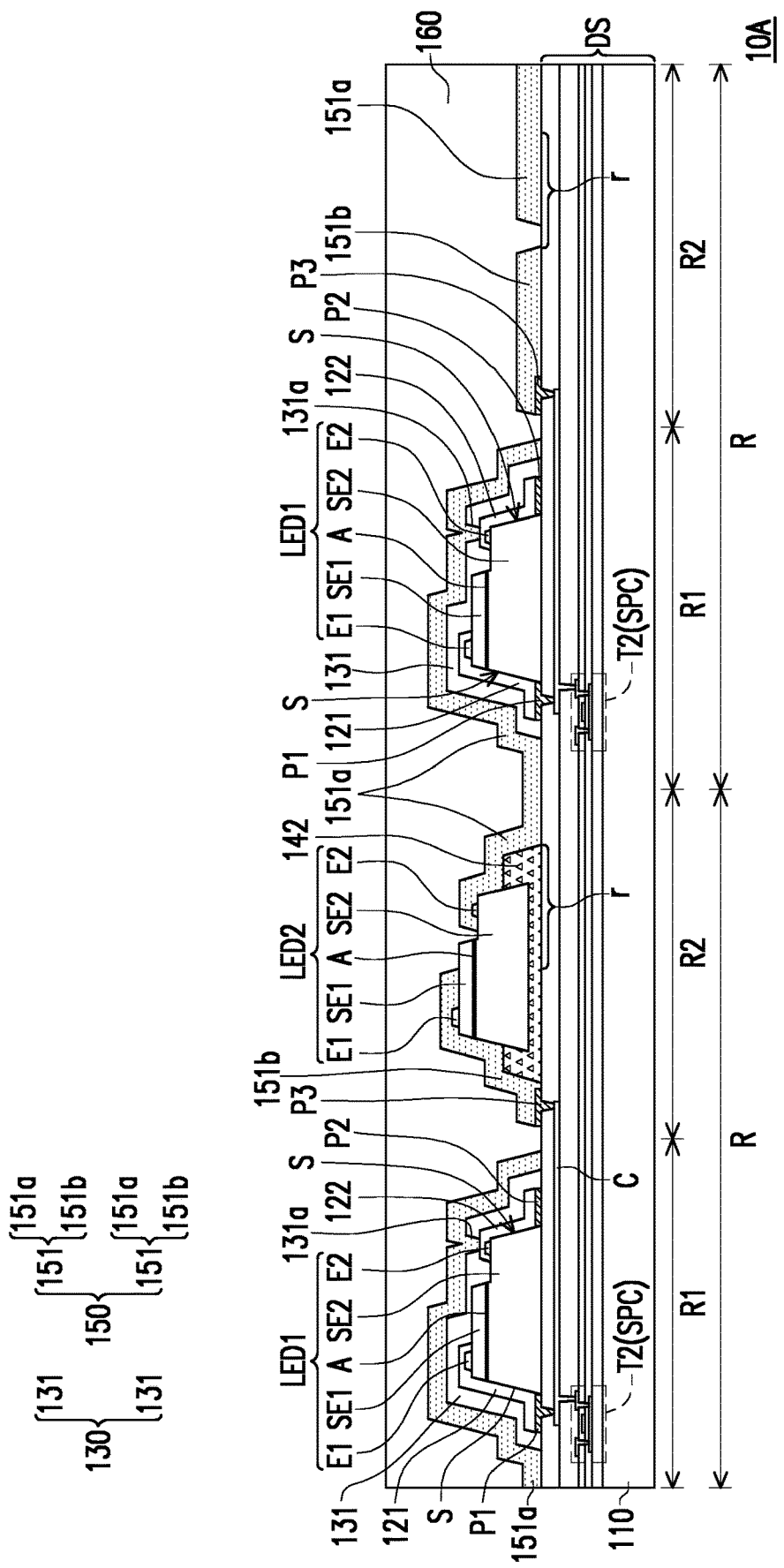

FIG. 5 shows a plurality of first pads P1, a plurality of second pads P2, a plurality of third pads P3, a plurality of connection lines C, a plurality of first light-emitting diode elements LED1, a plurality of first insulation patterns 131, a plurality of contacts 131a, a second adhesive pattern 142, a second light-emitting diode element LED2, and a plurality of reflective patterns 151 of FIG. 4F and omits the other members of FIG. 4F.

Referring to FIG. 4A to FIG. 4F and FIG. 5, the manufacturing process and structure of the display apparatus 10A of the present embodiment are similar to the manufacturing process and structure of the display apparatus 10 above. The difference between the two is: the repair method of the display apparatus 10A is slightly different from the repair method of the display apparatus 10, and the difference in the repair method also causes the structure of the display apparatus 10A to be slightly different from the structure of the display apparatus 10.

Referring to FIG. 4D and FIG. 5, specifically, in the present embodiment, the second adhesive pattern 142 is disposed on the second sub-region R2 of the pixel region R to be repaired using a dispenser or an inkjet. Therefore, the second adhesive pattern 142 is only provided on the second sub-region R2 of the repaired pixel region R, and the second adhesive pattern 142 is not provided on the second sub-region R2 of the unrepaired pixel region R (or not requiring repair).

Referring to FIG. 4E, in the present embodiment, in the unrepaired pixel region R (for example: the pixel region R on the right side of FIG. 4E and the pixel region R on the upper right corner of FIG. 5), the first portion 151a of the reflective pattern 151 is extended from above the first insulation pattern 131 onto the connection region r of the driving substrate DS and directly in contact with the connection region r of the driving substrate DS, and the second portion 151b of the reflective pattern 151 may be directly in contact with the third pad P3 of the driving substrate DS.

Figure 6:
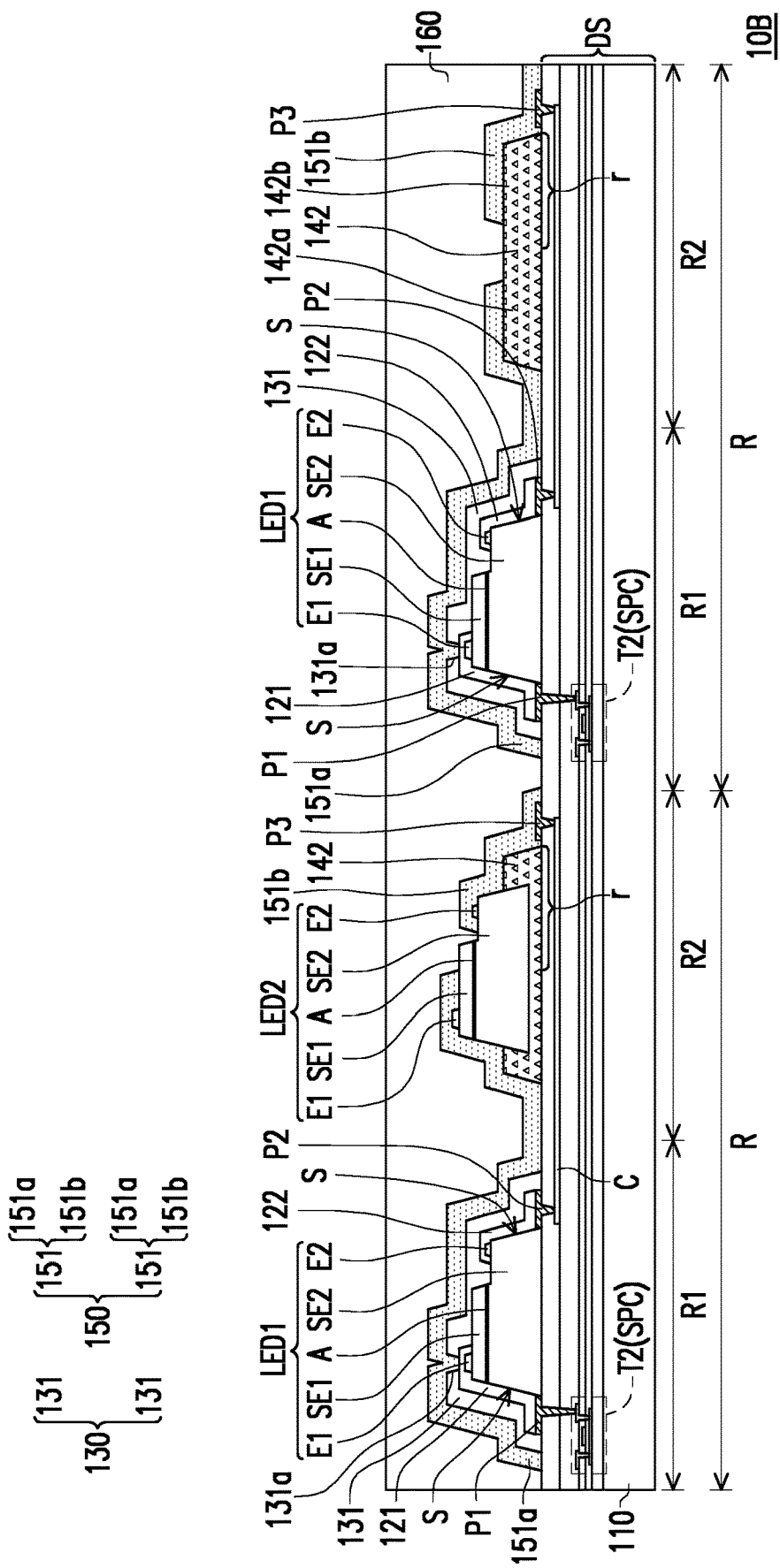
FIG. 6 is a side view and a perspective schematic diagram of a display apparatus 10B of an embodiment of the invention.

FIG. 6 is a side view and a perspective schematic diagram of a display apparatus 10B of an embodiment of the invention.

Figure 7:
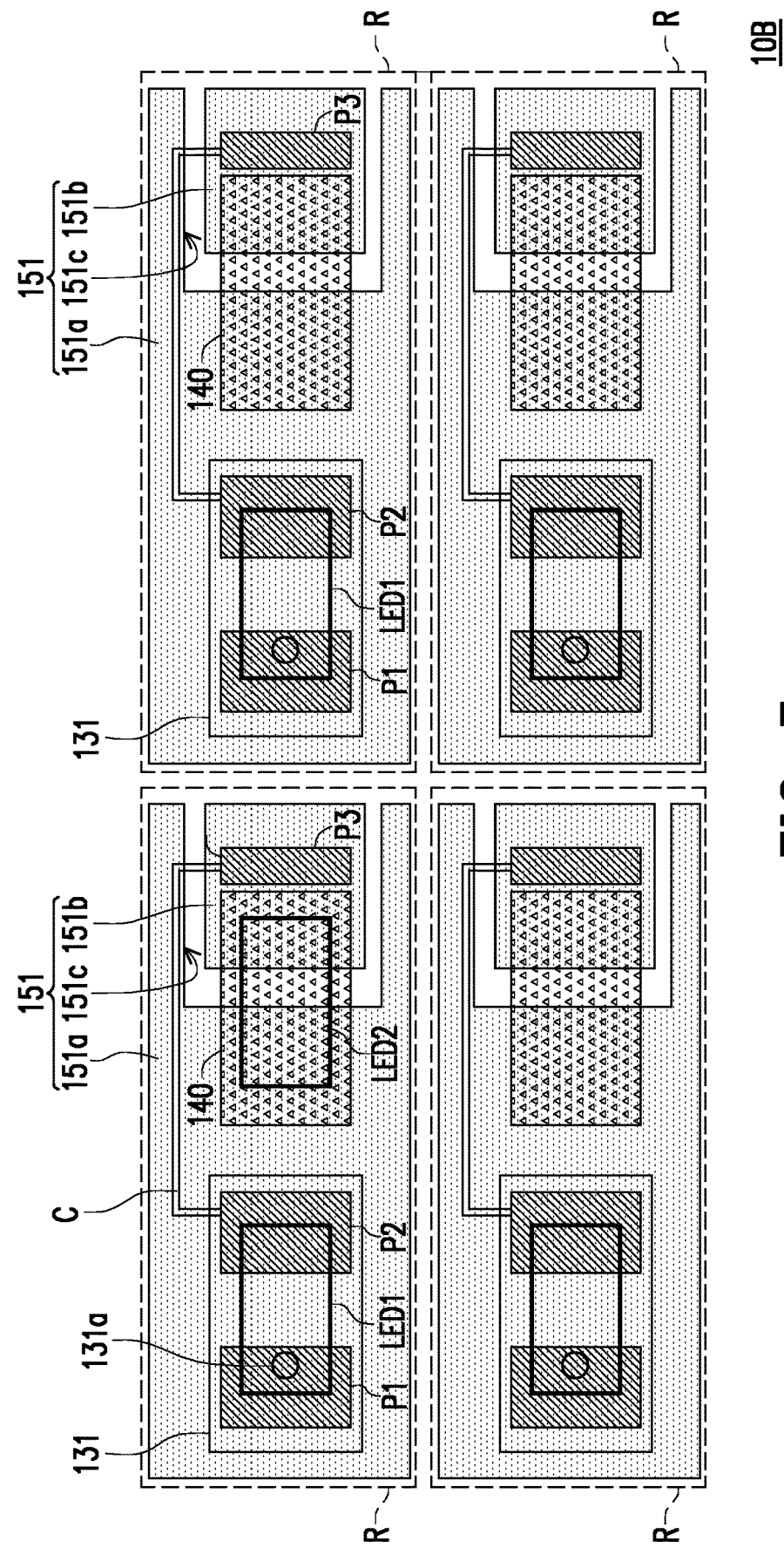
FIG. 7 is a top view and a perspective schematic diagram of the display apparatus 10B of an embodiment of the invention.

FIG. 7 is a top view and a perspective schematic diagram of the display apparatus 10B of an embodiment of the invention.

FIG. 7 shows a plurality of first pads P1, a plurality of second pads P2, a plurality of third pads P3, a plurality of connection lines C, a plurality of first light-emitting diode elements LED1, a plurality of first insulation patterns 131, a plurality of contacts 131a, a second adhesive pattern 142, a second light-emitting diode element LED2, and a plurality of reflective patterns 151 of FIG. 6 and omits the other members of FIG. 6.

Referring to FIG. 6 and FIG. 7, the manufacturing process and structure of the display apparatus 10B of the present embodiment are similar to the manufacturing process and structure of the display apparatus 10 described above. The differences between the two are described below. For the same or similar parts, please refer to the above description.

In the embodiment of FIG. 1F and FIG. 2, the third pads P3 are electrically connected to the first pads P1, and the first portions 151a of the reflective patterns 151 are electrically connected to the second electrodes E2 of the first light-emitting diode elements LED1 and the second pads P2. In other words, in the embodiments of FIG. 1F and FIG. 2, the first portions 151a of the reflective patterns 151 may be regarded as cathodes on the pixel regions R. In the embodiments of FIGS. 1F and 2, since the first portion 151a of each of the reflective patterns 151 is a cathode, the plurality of first portions 151a of the plurality of reflective patterns 151 respectively located at the plurality of pixel regions R may be directly connected, but the invention is not limited thereto.

In the embodiment of FIG. 6 and FIG. 7, the third pads P3 are electrically connected to the second pads P2, and the first portions 151a of the reflective patterns 151 are electrically connected to the first electrodes E1 of the first light-emitting diode elements LED1 and the first pads P1. In other words, in the embodiment of FIG. 6 and FIG. 7, the first portions 151a of the reflective patterns 151 may be regarded as anodes on the pixel regions R. In the embodiment of FIGS. 6 and 7, since the first portion 151a of each of the reflective patterns 151 is an anode, the plurality of first portions 151a of the plurality of reflective patterns 151 respectively located at the plurality of pixel regions R are separated from one another. In addition, in the embodiment of FIG. 6 and FIG. 7, the openings 151c of the reflective patterns 151 may be open openings, but the invention is not limited thereto.

Figure 8:
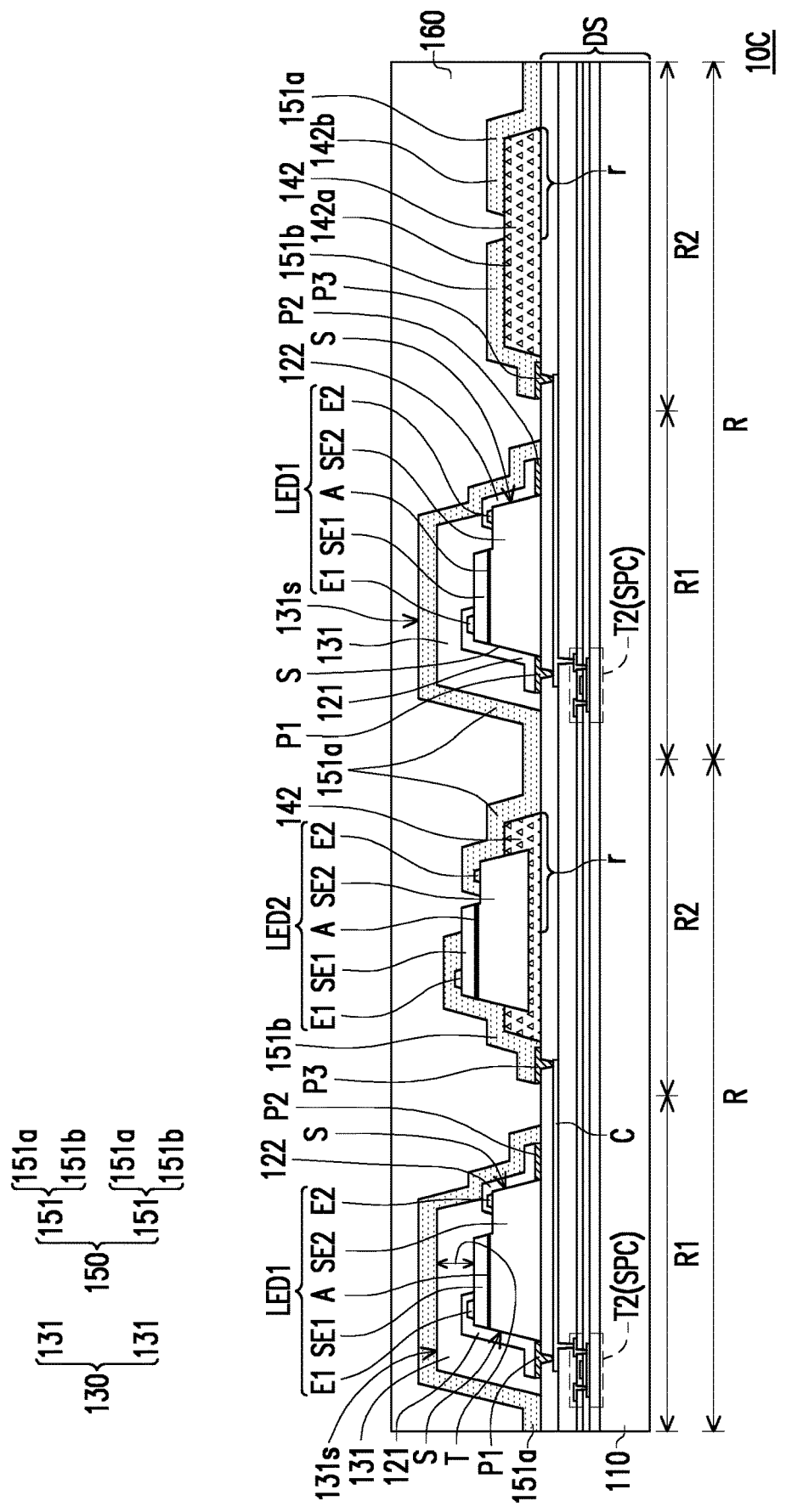
FIG. 8 is a side view and a perspective schematic diagram of a display apparatus 10C of an embodiment of the invention.

FIG. 8 is a side view and a perspective schematic diagram of a display apparatus 10C of an embodiment of the invention.

Referring to FIG. 8, the display apparatus 10C of the present embodiment is similar to the display apparatus 10 of FIG. 1F. The differences between the two are described below. For the same or similar parts, please refer to the above description.

One difference between the display apparatus 10C of FIG. 8 and the display apparatus 10 of FIG. 1F is a film thickness T of the first insulation patterns 131 of the display apparatus 10C of FIG. 8 is greater than the film thickness T of the first insulation patterns 131 of the display apparatus 10 of FIG. 1F. For example, the film thickness T of the first insulation patterns 131 of the display apparatus 10C of FIG. 8 may be greater than or equal to 1 and the film thickness T of the first insulation patterns 131 of the display apparatus 10 of FIG. 1F may be less than or equal to 8000 Å, but the invention is not limited thereto. In addition, in the embodiment of FIG. 8, the material of the first insulation patterns 131 may be an organic material or a polymer, but the invention is not limited thereto.

Please refer to FIG. 8, the thicker first insulation patterns 131 may prevent the reflective patterns 151 disposed on the first insulation patterns 131 from being conformal to the first light-emitting diode elements LED1. In the present embodiment, the first insulation patterns 131 have an upper surface 131s facing away from the driving substrate DS, and the upper surface 131s of the first insulation patterns 131 is substantially a flat surface. Due to the thicker first insulation patterns 131, the shape of the reflective patterns 151 disposed on the first insulation patterns 131 is not limited to the shape of the first light-emitting diode elements LED1. In other words, the shape of the reflective patterns 151 may be designed according to actual needs, thereby improving the optical performance of the display apparatus 10C.

Another difference between the display apparatus 10C of FIG. 8 and the display apparatus 10 of FIG. 1F is that the first insulation patterns 131 of FIG. 8 may not have the contacts 131a of the first insulation patterns 131 of FIG. 1F. Referring to FIG. 8, in the present embodiment, the first insulation patterns 131 may be disposed on a portion of the first connection elements 121, the first light-emitting diode elements LED1, and the second connection elements 122, and the first insulation patterns 131 may not be overlapped with another portion of the second connection elements 122 located on the second pads P2.

Figure 9:
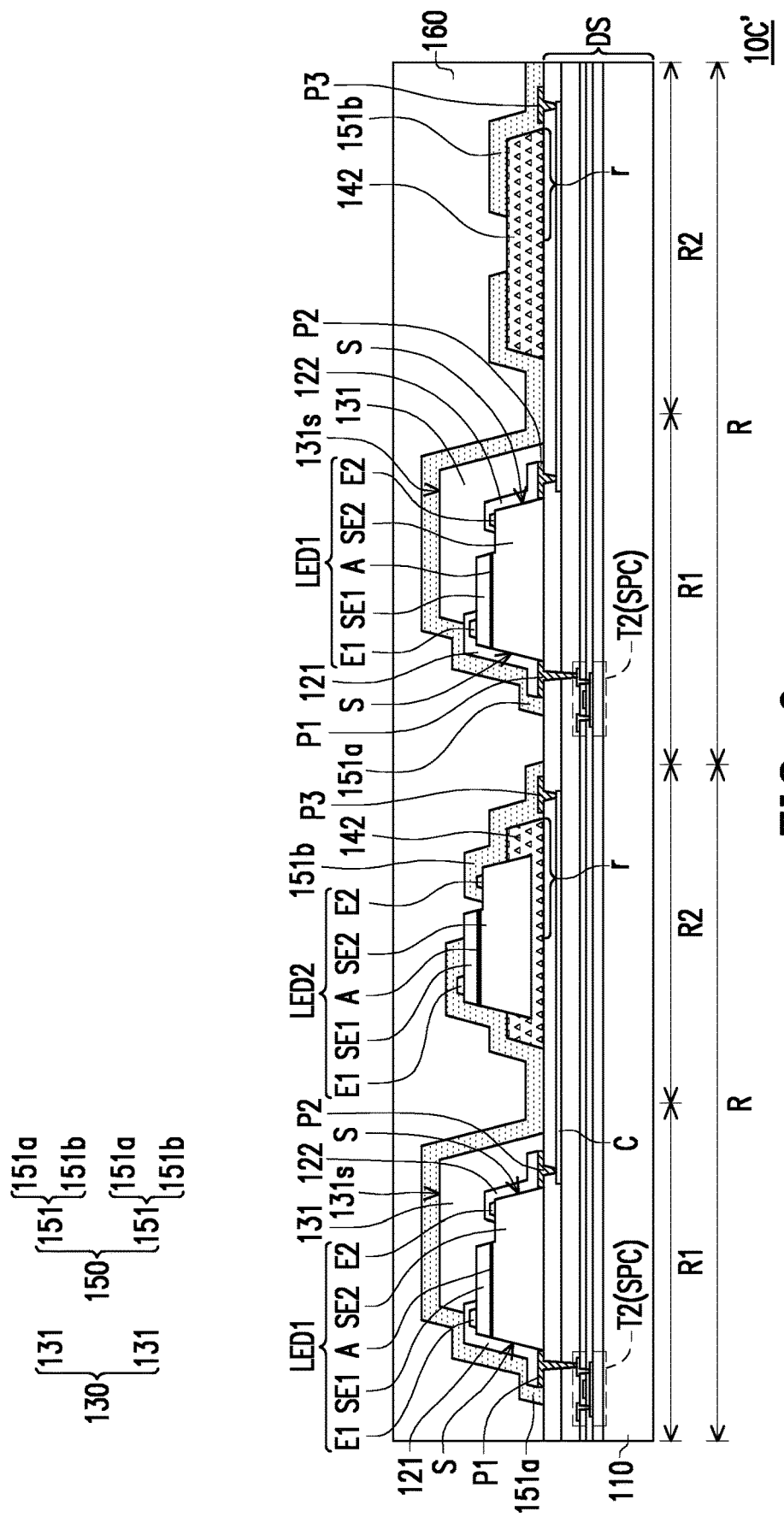
FIG. 9 is a side view and a perspective schematic diagram of a display apparatus 10C' of an embodiment of the invention.

FIG. 9 is a side view and a perspective schematic diagram of a display apparatus 10C' of an embodiment of the invention.

Referring to FIG. 9, the display apparatus 10C' of the present embodiment is similar to the display apparatus 10C of FIG. 8. The differences between the two are described below. For the same or similar parts, please refer to the above description.

The differences between the display apparatus 10C' of FIG. 9 and the display apparatus 10C of FIG. 8 is: in the embodiment of FIG. 8, the third pads P3 are electrically connected to the first pads P1, and the first portions 151a of the reflective patterns 151 are electrically connected to the second electrodes E2 of the first light-emitting diode elements LED1 and the second pads P2; in other words, in the embodiment of FIG. 8, the first portions 151a of the reflective patterns 151 may be regarded as cathodes on the pixel regions R; in the embodiment of FIG. 9, the third pads P3 are electrically connected to the second pads P2, and the first portions 151a of the reflective patterns 151 are electrically connected to the first electrodes E1 of the first light-emitting diode elements LED1 and the first pads P1; in other words, in the embodiment of FIG. 9, the first portions 151a of the reflective patterns 151 may be regarded as anodes on the pixel regions R.

FIG. 10A to FIG. 10E are side views and perspective schematic diagrams of the manufacturing process of a display apparatus 10D of an embodiment of the invention.

The manufacturing process and structure of the display apparatus 10D of FIG. 10A to FIG. 10E are similar to the manufacturing process and structure of the display apparatus 10 of FIG. 1A to FIG. 1F. The difference between the two is: the repair method of the display apparatus 10D is slightly different from the repair method of the display apparatus 10, and the difference in the repair method also causes the structure of the display apparatus 10D to be slightly different from the structure of the display apparatus 10.

In the following, the differences between the manufacturing process and structure of the display apparatus 10D of the present embodiment and the manufacturing process and structure of the display apparatus 10D of the above embodiment are described with FIG. 10A to FIG. 10E.

Figure 10A:
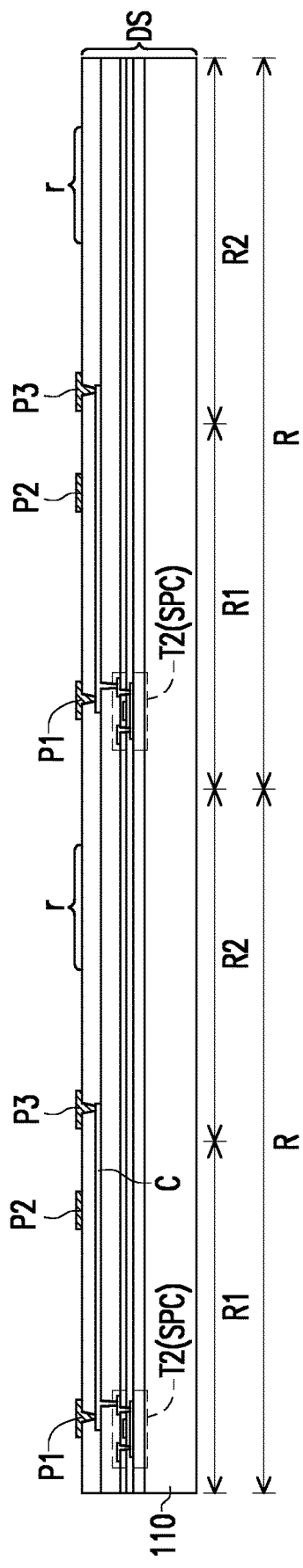
FIG. 10A to FIG. 10E are side views and perspective schematic diagrams of the manufacturing process of a display apparatus 10D of an embodiment of the invention.
Figure 10B:
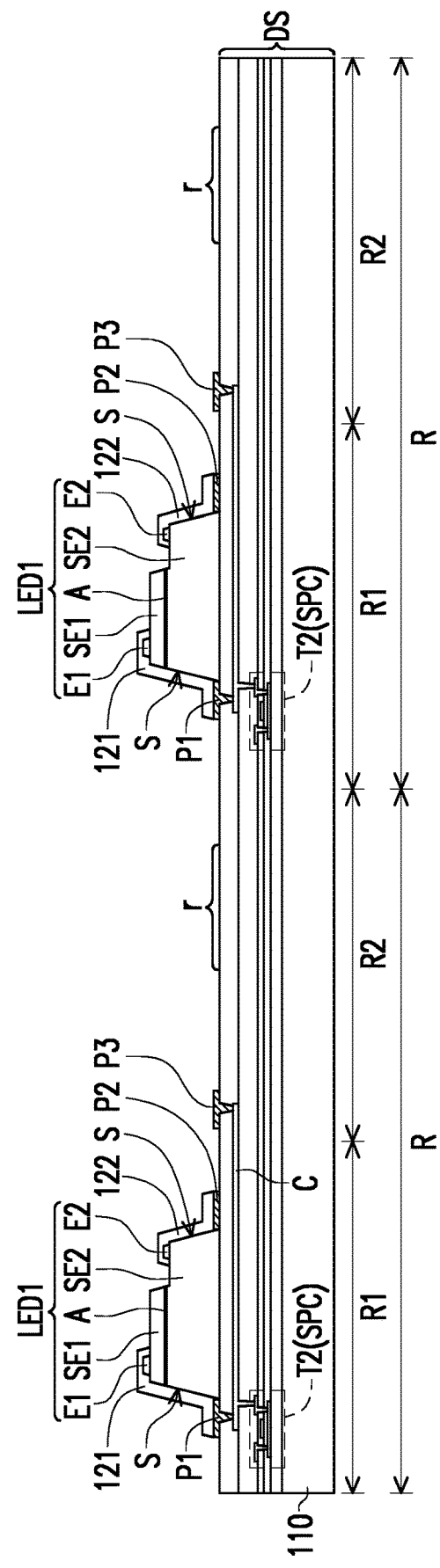

Please refer to FIG. 10A. First, the driving substrate DS is provided. Please refer to FIG. 10B. Next, the plurality of first light-emitting diode elements LED1 are transferred onto the plurality of first sub-regions R1 of the plurality of pixel regions R of the driving substrate DS. Referring to FIG. 1B, next, the plurality of first connection elements 121 and the plurality of second connection elements 122 are formed so that the plurality of first light-emitting diode elements LED1 are electrically connected to the plurality of first pads Pb and the plurality of second pads P2 of the plurality of pixel regions R, respectively.

Figure 10C:
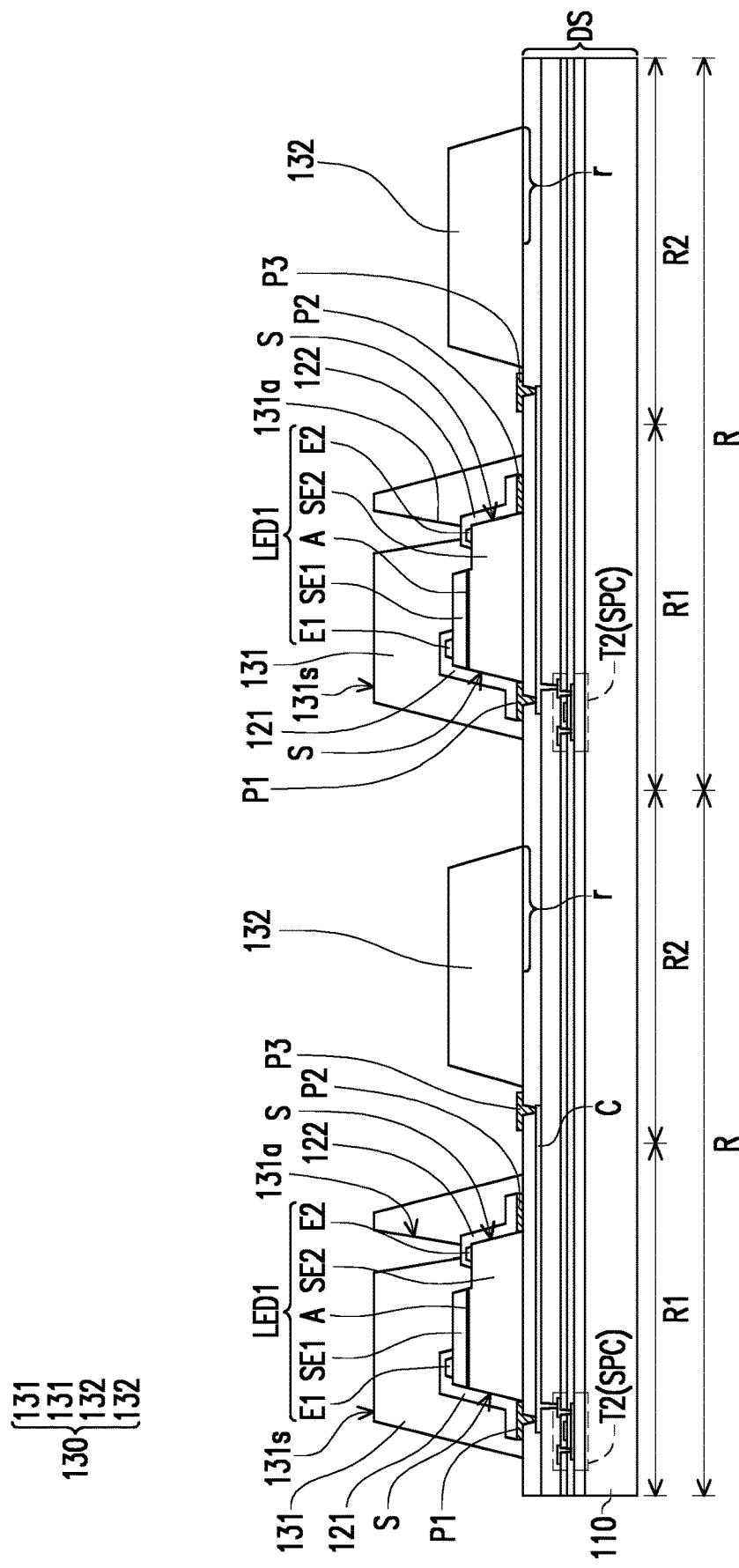

Please refer to FIG. 10C. Next, the insulation layer 130 is formed. The difference from the display apparatus 10 is that in the present embodiment, in addition to the plurality of first insulation patterns 131 respectively disposed on the plurality of first sub-regions R1 of the plurality of pixel regions R, the insulation layer 130 also includes a plurality of second insulation patterns 132 respectively disposed on the plurality of second sub-regions R2 of the plurality of pixel regions R. The first insulation patterns 131 and the second insulation patterns 132s belong to the same insulation layer 130, and the material of the second insulation patterns 132 is the same as the material of the first insulation patterns 131.

Please refer to FIG. 10C. Whether the plurality of first light-emitting diode elements LED1 may be driven by the driving substrate DS to normally emit light is detected. If it is found that the first light-emitting diode element LED1 of a pixel region R may not be driven by the driving substrate DS to normally emit light, a repair operation is performed on the second sub-region R2 of the pixel region R.

Figure 10D:
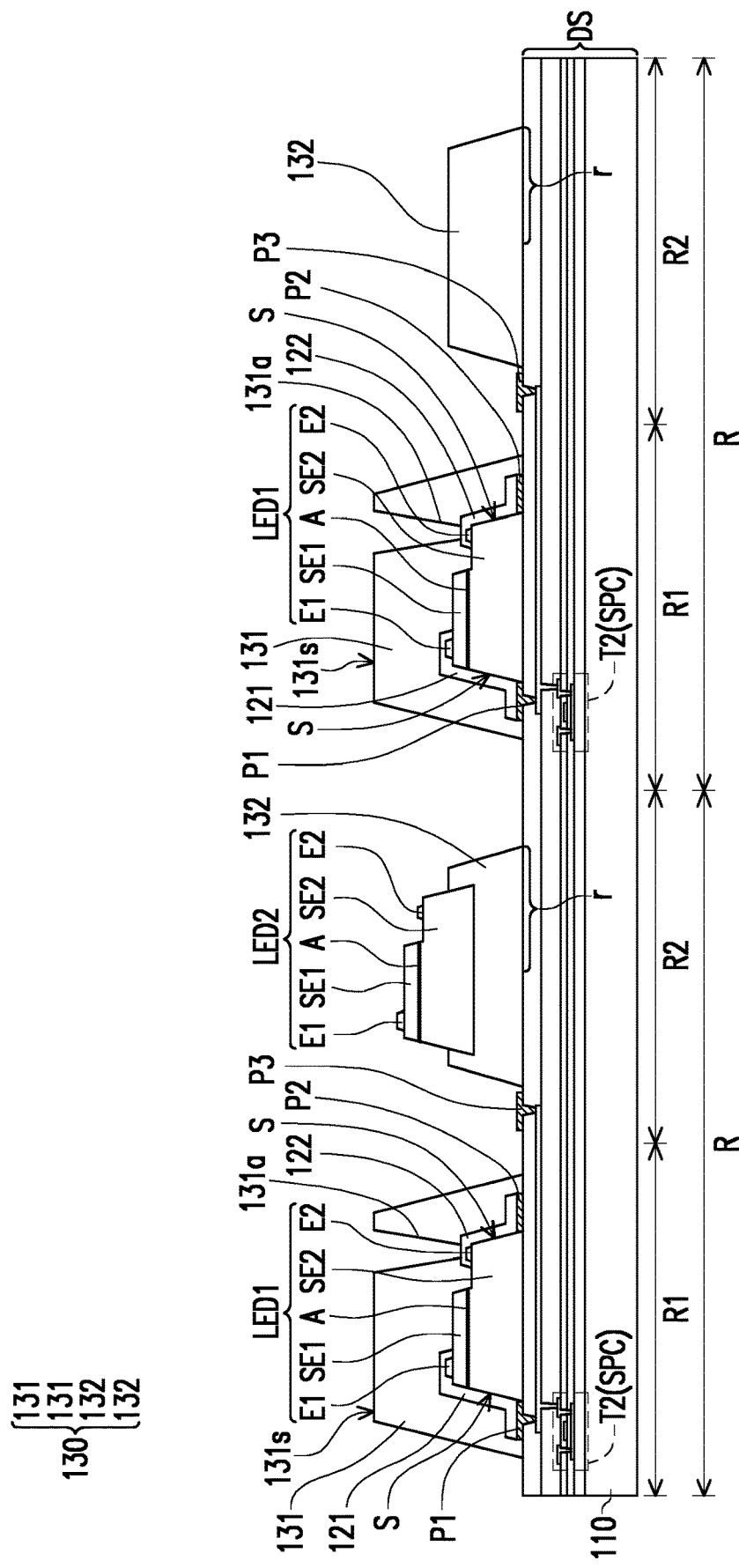

Referring to FIG. 10C and FIG. 10D, different from the display apparatus 10, in the present embodiment, a second light-emitting diode element LED2 may be transferred onto the second insulation pattern 132 of the pixel region R to be repaired. That is to say, in the present embodiment, the second insulation patterns 132 of the insulation layer 130 are used as adhesive patterns for fixing the second light-emitting diode element LED2.

Figure 10E:
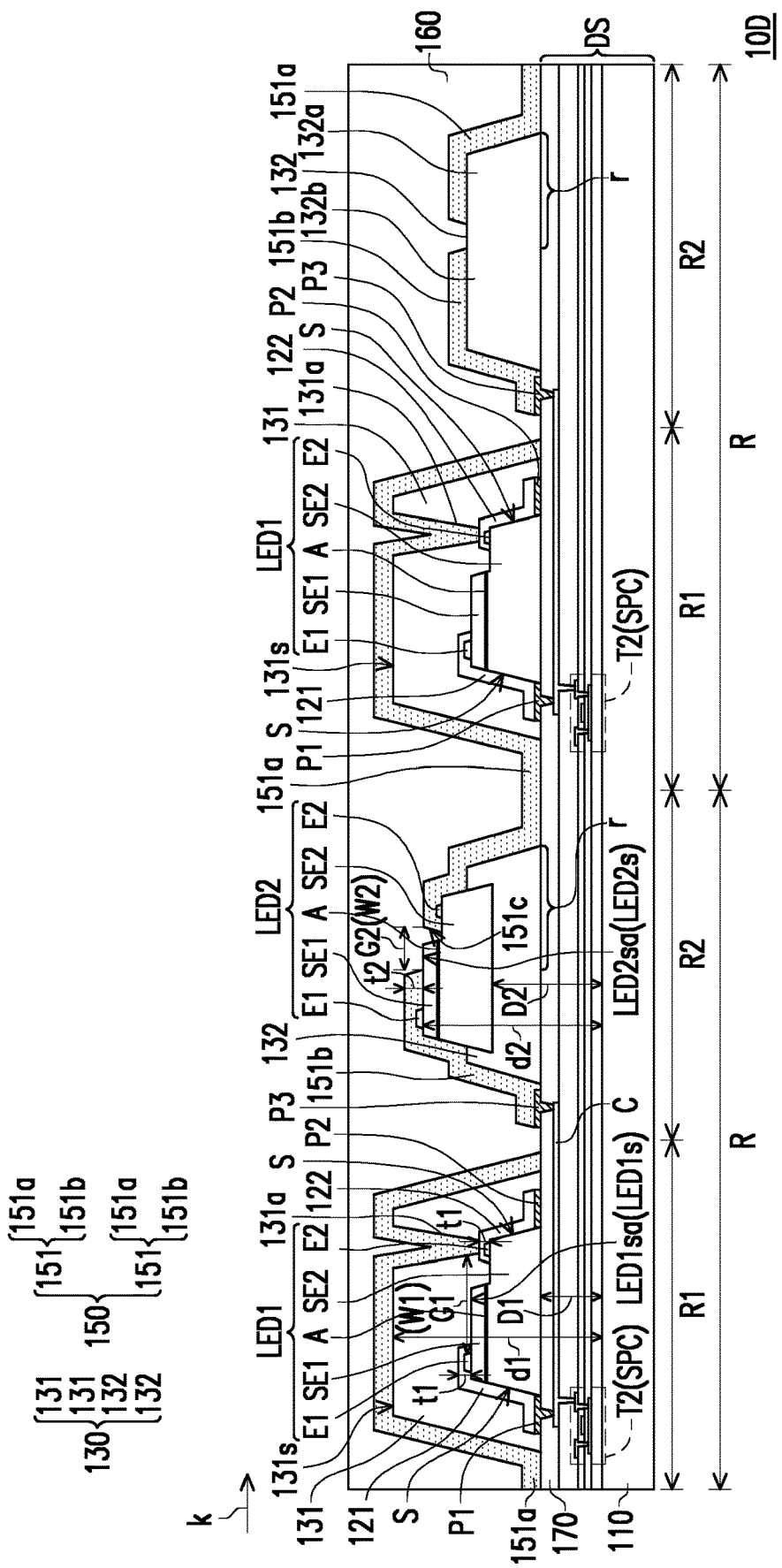

Referring to FIG. 10E, then, the reflective layer 150 is formed on the insulation layer 130. Lastly, the flat layer 160 is formed on the reflective layer 150. At this point, the display apparatus 10D of the present embodiment is completed.

The difference in structure between the display apparatus 10D of FIG. 10E and the display apparatus 10 of FIG. 1F is: in the embodiment of FIG. 10E, the display apparatus 10D does not include the second adhesive patterns 142 of the display apparatus 10 of FIG. 1F, and the second adhesive patterns 142 of the display apparatus 10 of FIG. 1F are replaced by the second insulation patterns 132 of the insulation layer 130.

Referring to FIG. 10E, in the repaired pixel region R (for example: the pixel region R on the left side of FIG. 10E), the second light-emitting diode element LED2 is disposed on the second insulation pattern 132, the second light-emitting diode element LED2 has the first electrode E1 and the second electrode E2, one of the first electrode E1 and the second electrode E2 (for example, but not limited to: the second electrode E2) of the second light-emitting diode element LED2 is disposed on the connection region r of the driving substrate DS, and the first portion 151a of the reflective pattern 151 is electrically connected to the one of the first electrode E1 and the second electrode E2 (for example, but not limited to: the second electrode E2) of the second light-emitting diode element LED2.

In the present embodiment, a distance D2 between the second light-emitting diode element LED2 and the base 110 of the driving substrate DS is greater than a distance D1 between the first light-emitting diode elements LED1 and the driving substrate DS, and a distance d2 between the second portion 151b of the reflective pattern 151 located on one of the first electrode E1 and the second electrode E2 (for example, the first electrode E1) of the second light-emitting diode element LED2 and the base 110 of the driving substrate DS is less than a distance d1 between the first portion 151a of the reflective pattern 151 located on the upper surface 131s of the first insulation pattern 131 and the base 110 of the driving substrate DS, wherein the upper surface 131s of the first insulation pattern 131 faces away from the base 110 of the driving substrate DS.

In short, in the present embodiment, the position of the second light-emitting diode element LED2 is higher than the position of the first light-emitting diode elements LED1, but the packaging height of the second light-emitting diode element LED2 is less than the packaging height of the first light-emitting diode elements LED1.

Referring to FIG. 10E, in the unrepaired pixel region R (for example: the pixel region R on the right side of FIG. 10E), the second insulation pattern 132 is disposed on the driving substrate DS, the second insulation pattern 132 has a first end 132a and a second end 132b opposite to each other, the first end 132a of the second insulation pattern 132 is disposed on the connection region r of the driving substrate DS, the first portion 151a of the reflective pattern 151 is disposed on the first end 132a of the second insulation pattern 132, and the second portion 151b of the reflective pattern 151 is disposed on the second end 132b of the second insulation pattern 132.

Referring to FIG. 10E, in each of the pixel regions R, the first connection element 121 and the second connection element 122 have a first gap G1 on the first light-emitting diode element LED1, the first portion 151a of the reflective pattern 151 and the second portion 151b of the reflective pattern 151 have a second gap G2 located on the connection region r, and the first gap G1 and the second gap G2 respectively have a first width W1 and a second width W2 in a same direction k; the second width W2 is less than the first width W1 in both the unrepaired pixel region R and the repaired pixel region R. For example, in the present embodiment, W1≥(2+x)μm, W2≥2 μm, wherein x>0 μm, but the invention is not limited thereto.

In the repaired pixel region R, the first portion 151a of the reflective pattern 151 and the second portion 151b of the reflective pattern 151 may not be connected to each other but may be as close as possible to reduce the loss caused by the light beam (not shown) emitted by the second light-emitting diode element LED2 exiting from the second gap G2.

In the present embodiment, the first light-emitting diode elements LED1 have an upper surface LED1s facing away from the driving substrate DS, a region LED1sa of the upper surface LED1s is located between the first connection element 121 and the second connection element 122, and the reflective pattern 151 is not only overlapped with the first connection element 121 and the second connection element 122, but is also overlapped with the region LED1sa of the upper surface LED1s of the first light-emitting diode elements LED1; the second light-emitting diode element LED2 has an upper surface LED2s facing away from the driving substrate DS, a region LED2sa of the upper surface LED2s is located between the first electrode E1 and the second electrode E2, and the opening 151c of the reflective pattern 151 is overlapped with the region LED2sa of the upper surface LED2s of the second light-emitting diode element LED2.

In short, in the present embodiment, the reflective layer 150 completely covers the first light-emitting diode elements LED1, but the reflective layer 150 does not completely cover the second light-emitting diode element LED2, and the reflection effect of the reflective layer 150 on the second light-emitting diode element LED2 is lower than the reflection effect of the reflective layer 150 on the first light-emitting diode elements LED1.

However, to make the optical performance of the second sub-region R2 of the repaired pixel region R close to or equal to the optical performance of the first sub-region R1 of the unrepaired pixel region R, in an embodiment, the luminous efficiency of the second light-emitting diode element LED2 located on the second sub-region R2 of the repaired pixel region R may be higher than the luminous efficiency of the first light-emitting diode element LED1 on the first sub-region R1 of the unrepaired pixel region R.

However, the invention is not limited thereto, and in other embodiments, other methods or combinations of the above methods and other methods may also be used so that the optical performance of the second sub-region R2 of the repaired pixel region R is close to or equal to the optical performance of the first sub-region R1 of the unrepaired pixel region R. For example, in an embodiment, a film thickness t2 of the reflective pattern 151 may be greater than a film thickness t1 of at least one of the first connection element 121 and the second connection element 122; thereby, the resistance of the conductive element (i.e., the reflective pattern 151) between the second light-emitting diode element LED2 on the repaired pixel region R and the driving substrate DS is less than the resistance of the conductive elements (i.e., the first connection element 121 and the second connection element 122) between the first light-emitting diode element LED1 on the unrepaired pixel region R and the driving substrate DS; in this way, when the drive signal of the pixel driving circuit SPC of the repaired pixel region R is the same as the drive signal of the pixel driving circuit SPC of the unrepaired pixel region R, the luminous brightness of the second light-emitting diode element LED2 on the repaired pixel region R is greater than the luminous brightness of the first light-emitting diode element LED1 on the unrepaired pixel region R, so that the optical performance of the second sub-region R2 of the repaired pixel region R is close to or equal to the optical performance of the first sub-region R1 of the unrepaired pixel region R.

Moreover, in an embodiment, the refractive index of the second insulation patterns 132 may be between the refractive index of a portion of the second light-emitting diode element LED2 (for example: a semiconductor layer of the second light-emitting diode element LED2 close to the second insulation patterns 132) and the refractive index of a portion of the driving substrate DS (for example: a dielectric layer 170 between the third pads P3 and the pixel driving circuits SPC). In this way, the light extraction efficiency of the second light-emitting diode element LED2 on the second sub-region R2 of the repaired pixel region R may be improved.

Figure 11:
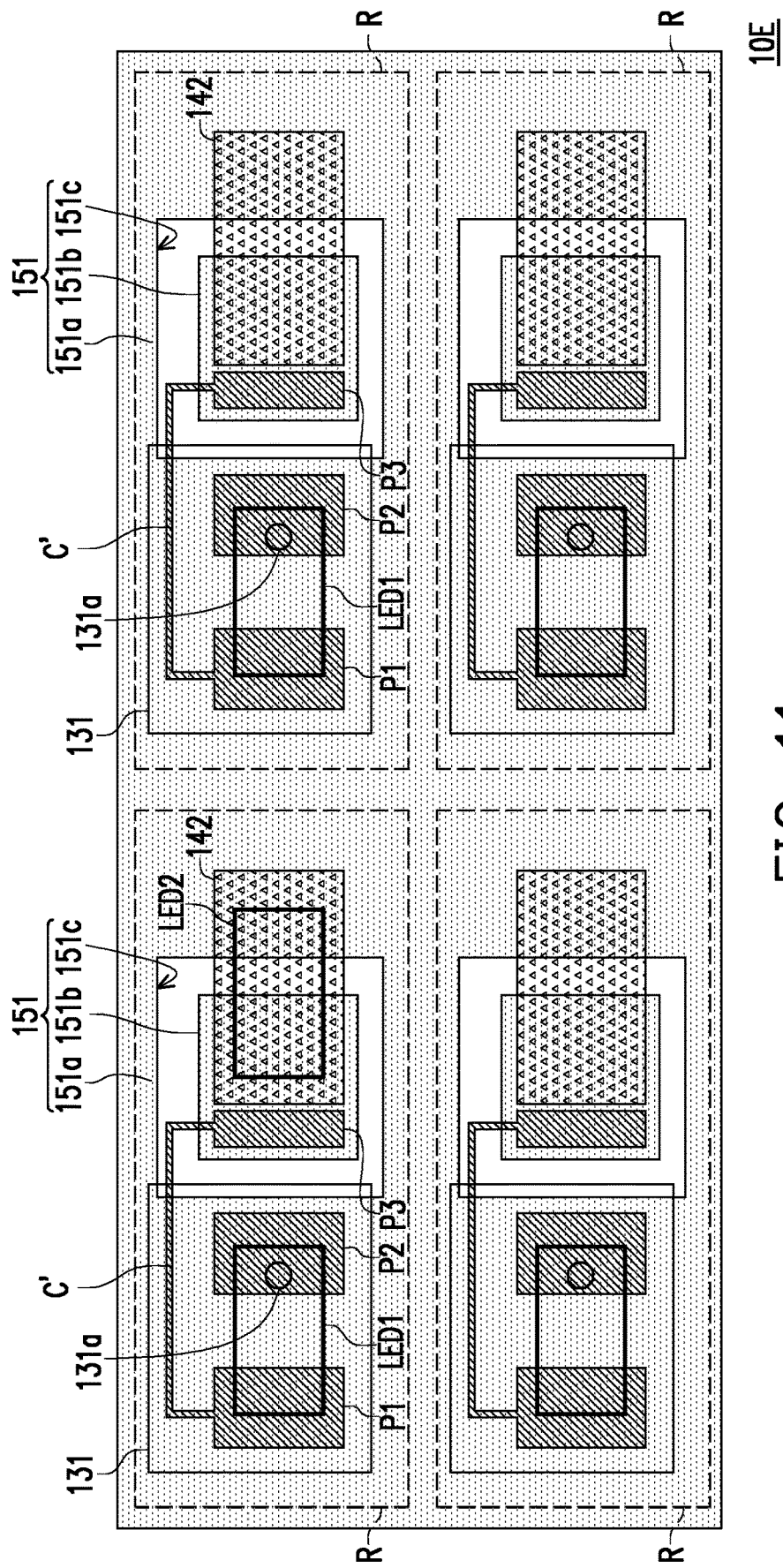
FIG. 11 is a top view and a perspective schematic diagram of a display apparatus 10E of an embodiment of the invention.

FIG. 11 is a top view and a perspective schematic diagram of a display apparatus 10E of an embodiment of the invention.

The display apparatus 10E of FIG. 11 is similar to the display apparatus 10 of FIG. 1F and FIG. 2. The differences between the two are described below. For the same or similar parts, please refer to the above description, which are not repeated herein.

Referring to FIG. 1F, FIG. 2, and FIG. 11, the connection lines C are electrically connected to one of the first pads P1 and the second pads P2 (for example, but not limited to: the first pads P1) and the third pads P3.

In the embodiment of FIG. 1F and FIG. 2, the connection lines C, the first pads P1, the second pads P2, and the third pads P3 are not coplanar. The film layer to which the connection lines C belong is different from the film layer to which the first pads P1 to the third pads P3 belong.

In the embodiment of FIG. 11, connection lines C', the first pads P1, the second pads P2, and the third pads P3 may be coplanar; and the connection lines C', the first pads P1, the second pads P2, and the third pads P3 may belong to the same film layer.

In the embodiment of FIG. 11, the reflective patterns 151 are overlapped with the connection lines C' of the driving substrate DS, and the first insulation patterns 131 are disposed on the connection lines C'. In other words, when the connection lines C' are disposed on the surface of the driving substrate DS, the first insulation patterns 131 may be disposed on the overlapped portion of the connection lines C' and the reflective patterns 151 to avoid a short circuit between the connection lines C' and the reflective patterns 151. However, the invention is not limited thereto. In other embodiments, other members may also be used as the insulation patterns between the connection lines C' and the reflective patterns 151, which is described below with reference to FIG. 12 as an example.

Figure 12:
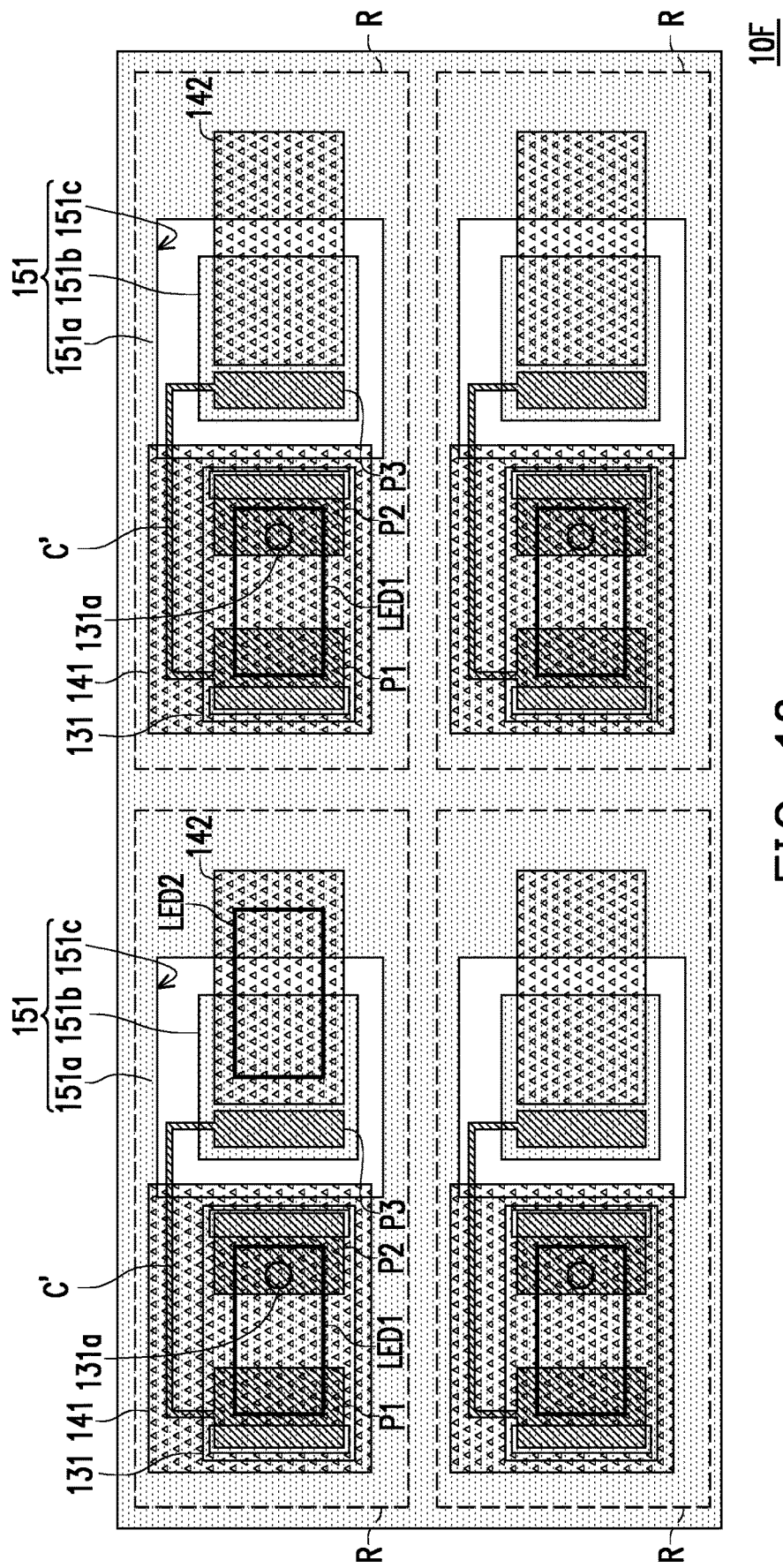
FIG. 12 is a top view and a perspective schematic diagram of a display apparatus 10F of an embodiment of the invention.

FIG. 12 is a top view and a perspective schematic diagram of a display apparatus 10F of an embodiment of the invention.

The display apparatus 10F of FIG. 12 is similar to the display apparatus 10 of FIG. 1F and FIG. 2. The differences between the two are described below. For the same or similar parts, please refer to the above description, which are not repeated herein.

Please refer to FIG. 12, the display apparatus 10F further includes first adhesive patterns 141 disposed on the driving substrate DS, wherein the first light-emitting diode elements LED1 are disposed on the first adhesive patterns 141. The driving substrate DS further has the connection lines C', wherein the connection lines C' are electrically connected to one of the first pads P1 and the second pads P2 and the third pads P3, the reflective patterns 151 are overlapped with the connection lines C' of the driving substrate DS, and the first adhesive patterns 141 are disposed on the connection lines C'.

When the connection lines C' are disposed on the surface of the driving substrate DS, the first adhesive patterns 141 under the first light-emitting diode elements LED1 may also be used as the insulation patterns between the connection lines C' and the reflective patterns 151 to avoid a short circuit between the connection lines C' and the reflective patterns 151.

What is claimed is:
1. A display apparatus, comprising:
a driving substrate having a first pad, a second pad, a third pad, and a connection region, wherein the first pad is disposed opposite to the second pad, the third pad is disposed opposite to the connection region, and the third pad is electrically connected to one of the first pad and the second pad;

a first light-emitting diode element disposed on the driving substrate and having a first electrode and a second electrode;

a first connection element and a second connection element disposed on a sidewall of the first light-emitting diode element, wherein the first connection element is electrically connected to the first electrode of the first light-emitting diode element and the first pad of the driving substrate, and the second connection element is electrically connected to the second electrode of the first light-emitting diode element and the second pad of the driving substrate;

a first insulation pattern disposed on the first light-emitting diode element, the first connection element, and the second connection element, wherein one of the first connection element and the second connection element is electrically connected to the third pad; and a reflective pattern disposed on the first insulation pattern, wherein the reflective pattern comprises:
  a first portion electrically connected to the other of the first connection element and the second connection element, and extended from above the first light-emitting diode element onto the connection region of the driving substrate; and
  a second portion electrically connected to the third pad of the driving substrate and structurally separated from the first portion of the reflective pattern.

2. The display apparatus of claim 1, wherein the first portion of the reflective pattern has an opening, and the second portion of the reflective pattern is disposed in the opening of the first portion.

3. The display apparatus of claim 1, wherein the driving substrate further has a connection line, the connection line is electrically connected to the one of the first pad and the second pad and the third pad, the reflective pattern is overlapped with the connection line of the driving substrate, and the first insulation pattern is disposed on the connection line.

4. The display apparatus of claim 1, further comprising:
a first adhesive pattern disposed on the driving substrate, wherein the first light-emitting diode element is disposed on the first adhesive pattern;
wherein the driving substrate further has a connection line, the connection line is electrically connected to the one of the first pad and the second pad and the third pad, the reflective pattern is overlapped with the connection line of the driving substrate, and the first adhesive pattern is disposed on the connection line.

5. The display apparatus of claim 1, wherein a film thickness of the reflective pattern is greater than a film thickness of at least one of the first connection element and the second connection element.

6. The display apparatus of claim 1, wherein the first insulation pattern has an upper surface facing away from the driving substrate, and the upper surface of the first insulation pattern is substantially a flat surface.

7. The display apparatus of claim 1, wherein the first connection element and the second connection element have a first gap on the first light-emitting diode element, the first portion of the reflective pattern and the second portion of the reflective pattern have a second gap located on the connection region, the first gap and the second gap respectively have a first width and a second width in a same direction, and the second width is less than the first width.

8. The display apparatus of claim 1, wherein the first light-emitting diode element has an upper surface facing away from the driving substrate, a region of the upper surface is located between the first connection element and the second connection element, and the reflective pattern is overlapped with the region of the upper surface of the first light-emitting diode element, the first connection element, and the second connection element.

9. The display apparatus of claim 1, further comprising:
a second light-emitting diode element disposed on the driving substrate, wherein the second light-emitting diode element has a first electrode and a second electrode, one of the first electrode and the second electrode of the second light-emitting diode element is disposed on the connection region of the driving substrate, and the first portion of the reflective pattern is electrically connected to the one of the first electrode and the second electrode of the second light-emitting diode element.

10. The display apparatus of claim 9, wherein the second portion of the reflective pattern is electrically connected to another of the first electrode and the second electrode of the second light-emitting diode element and the third pad of the driving substrate.

11. The display apparatus of claim 9, wherein a luminous efficiency of the second light-emitting diode element is higher than a luminous efficiency of the first light-emitting diode element.

12. The display apparatus of claim 1, further comprising:
a second insulation pattern disposed on the driving substrate, wherein the second insulation pattern has a first end and a second end opposite to each other, the first end of the second insulation pattern is disposed on the connection region of the driving substrate, the first portion of the reflective pattern is disposed on the first end of the second insulation pattern, and the second portion of the reflective pattern is disposed on the second end of the second insulation pattern.

13. The display apparatus of claim 12, wherein a material of the second insulation pattern is the same as a material of the first insulation pattern.

14. The display apparatus of claim 12, further comprising:
a second light-emitting diode element disposed on the second insulation pattern, wherein the second light-emitting diode element has a first electrode and a second electrode, one of the first electrode and the second electrode of the second light-emitting diode element is disposed on the connection region of the driving substrate, and the first portion of the reflective pattern is electrically connected to the one of the first electrode and the second electrode of the second light-emitting diode element.

15. The display apparatus of claim 12, further comprising:
a second light-emitting diode element disposed on the second insulation pattern, wherein the second light-emitting diode element has a first electrode and a second electrode, one of the first electrode and the second electrode of the second light-emitting diode element is disposed on the connection region of the driving substrate, and the first portion of the reflective pattern is electrically connected to the one of the first electrode and the second electrode of the second light-emitting diode element;
a refractive index of the second insulation pattern is between a refractive index of a portion of the second light-emitting diode element and a refractive index of a portion of the driving substrate.

16. The display apparatus of claim 12, further comprising:
a second light-emitting diode element disposed on the second insulation pattern, wherein the second light-emitting diode element has a first electrode and a second electrode, one of the first electrode and the second electrode of the second light-emitting diode element is disposed on the connection region of the driving substrate, and the first portion of the reflective pattern is electrically connected to the one of the first electrode and the second electrode of the second light-emitting diode element;

a distance between the second light-emitting diode element and a base of the driving substrate is greater than a distance between the first light-emitting diode element and the base of the driving substrate, and a distance between the second portion of the reflective pattern on another of the first electrode and the second electrode of the second light-emitting diode element and the base of the driving substrate is less than a distance between the first portion of the reflective pattern located on an upper surface of the first insulation pattern and the base of the driving substrate, wherein the upper surface of the first insulation pattern faces away from the base of the driving substrate.

17. A display apparatus, comprising:

a driving substrate having a first pad and a second pad;

a first light-emitting diode element disposed on the driving substrate and having a first electrode and a second electrode;

a first connection element and a second connection element disposed on a sidewall of the first light-emitting diode element, wherein the first connection element is electrically connected to the first electrode of the first light-emitting diode element and the first pad of the driving substrate, and the second connection element is electrically connected to the second electrode of the first light-emitting diode element and the second pad of the driving substrate;

a first insulation pattern disposed on the first light-emitting diode element, the first connection element, and the second connection element; and a reflective pattern disposed on the first insulation pattern, wherein the first light-emitting diode element has an upper surface facing away from the driving substrate, a region of the upper surface is located between the first connection element and the second connection element, and the reflective pattern is overlapped with the region of the upper surface of the first light-emitting diode element, the first connection element, the second connection element, the first electrode of the first light-emitting diode element and the second electrode of the first light-emitting diode element.

* * * * *